(12) United States Patent  
Yoshida et al.

(10) Patent No.: US 9,399,277 B2  
(45) Date of Patent: Jul. 26, 2016

(54) POLISHING APPARATUS AND POLISHING METHOD

(71) Applicant: EBARA CORPORATION, Tokyo (JP)

(72) Inventors: Hiroshi Yoshida, Tokyo (JP); Makoto Fukushima, Tokyo (JP); Hozumi Yasuda, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/672,003

(22) Filed: Mar. 27, 2015

(65) Prior Publication Data

US 2015/0311097 A1    Oct. 29, 2015

(30) Foreign Application Priority Data

Mar. 31, 2014 (JP) ................. 2014-072965  
Nov. 11, 2014 (JP) ................. 2014-229169

(51) Int. Cl.
| | |
|---|---|
| H01L 21/302 | (2006.01) |
| H01L 21/461 | (2006.01) |
| B24B 37/10 | (2012.01) |
| B24B 37/34 | (2012.01) |
| H01L 21/02 | (2006.01) |
| H01L 21/67 | (2006.01) |

(52) U.S. Cl.  
CPC .............. *B24B 37/10* (2013.01); *B24B 37/345* (2013.01); *H01L 21/02024* (2013.01); *H01L 21/67219* (2013.01)

(58) Field of Classification Search  
CPC ..................................................... B24B 37/10  
See application file for complete search history.

(56) References Cited

U.S. PATENT DOCUMENTS

| | | | |
|---|---|---|---|
| 7,207,871 B1 | 4/2007 | Zuniga et al. | |
| 2005/0176354 A1 | 8/2005 | Park et al. | |
| 2006/0057942 A1 | 3/2006 | Kitahashi et al. | |
| 2009/0305612 A1 | 12/2009 | Miyazaki et al. | |
| 2012/0277897 A1* | 11/2012 | Zhang | B24B 37/005 700/103 |
| 2014/0065934 A1 | 3/2014 | Fukushima et al. | |

FOREIGN PATENT DOCUMENTS

| | | |
|---|---|---|
| JP | 2010-050436 | 3/2010 |
| WO | WO 01/74534 A2 | 10/2001 |

* cited by examiner

*Primary Examiner* — Roberts Culbert  
(74) *Attorney, Agent, or Firm* — Baker & Hostetler LLP

(57) ABSTRACT

A polishing apparatus capable of performing multi-stage polishing of a substrate, such as wafer, is disclosed. The polishing apparatus includes: a plurality of polishing tables each for supporting a polishing pad; a plurality of polishing heads each configured to press a substrate against the polishing pad; and a transporting device configured to transport the substrate to at least two of the plurality of polishing heads. The plurality of polishing heads have different structures.

10 Claims, 23 Drawing Sheets

FIG. 9
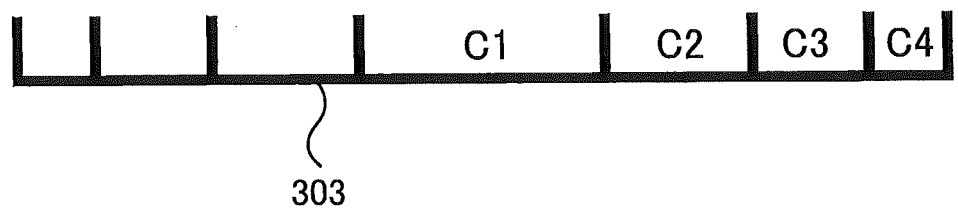
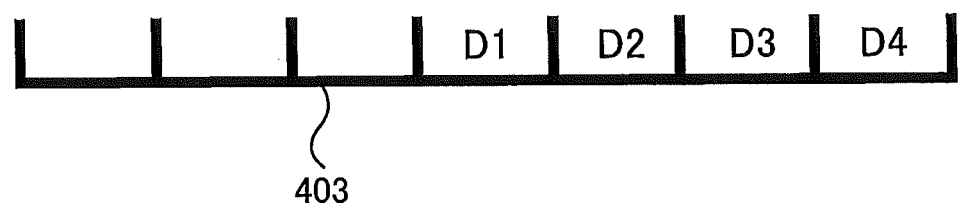
FIG. 10

FIG. 13

| TYPE OF POLISHING HEAD | FIRST POLISHING UNIT | SECOND POLISHING UNIT | THIRD POLISHING UNIT | FOURTH POLISHING UNIT |
|---|---|---|---|---|
| | RIGID-BODY POLISHING HEAD | SECOND MULTI-CHAMBER POLISHING HEAD | SECOND MULTI-CHAMBER POLISHING HEAD | RIGID-BODY POLISHING HEAD |
| TYPE OF WAFER POLISHING | ROUGH POLISHING | PROFILE CONTROL | FINE PROFILE ADJUSTMENT | FINAL POLISHING |

FIG. 14

EXAMPLE 1

HIGH POLISHING AMOUNT/
HIGH DEMAND FOR PLANARIZATION/
HIGH DEMAND FOR NO DEFECT

| FIRST POLISHING UNIT | SECOND POLISHING UNIT | THIRD POLISHING UNIT | FOURTH POLISHING UNIT |
|---|---|---|---|
| USE | USE | USE | USE |

EXAMPLE 2

LOW POLISHING AMOUNT/
HIGH DEMAND FOR PLANARIZATION/
HIGH DEMAND FOR NO DEFECT

| FIRST POLISHING UNIT | SECOND POLISHING UNIT | THIRD POLISHING UNIT | FOURTH POLISHING UNIT |
|---|---|---|---|
| NON-USE | USE | USE | USE |

EXAMPLE 3

LOW POLISHING AMOUNT/
LOW DEMAND FOR PLANARIZATION/
HIGH DEMAND FOR NO DEFECT

| FIRST POLISHING UNIT | SECOND POLISHING UNIT | THIRD POLISHING UNIT | FOURTH POLISHING UNIT |
|---|---|---|---|
| NON-USE | USE | NON-USE | USE |

EXAMPLE 4

HIGH POLISHING AMOUNT/
LOW DEMAND FOR PLANARIZATION/
LOW DEMAND FOR NO DEFECT

| FIRST POLISHING UNIT | SECOND POLISHING UNIT | THIRD POLISHING UNIT | FOURTH POLISHING UNIT |
|---|---|---|---|
| USE | USE | NON-USE | NON-USE |

EXAMPLE 5

LOW POLISHING AMOUNT/
HIGH DEMAND FOR PLANARIZATION/
LOW DEMAND FOR NO DEFECT

| FIRST POLISHING UNIT | SECOND POLISHING UNIT | THIRD POLISHING UNIT | FOURTH POLISHING UNIT |
|---|---|---|---|
| NON-USE | USE | USE | NON-USE |

POLISHING APPARATUS AND POLISHING METHOD

CROSS REFERENCE TO RELATED APPLICATIONS

This document claims priorities to Japanese Patent Application Number 2014-072965 filed Mar. 31, 2014 and Japanese Patent Application Number 2014-229169 filed Nov. 11, 2014, the entire contents of which are hereby incorporated by reference.

BACKGROUND

As semiconductor devices have been in a trend toward high integration and high density in recent years, circuit interconnects are also becoming smaller and finer, and the larger number of layers are used to form multilayer interconnects. The multilayer interconnects with the finer circuits entail greater surface steps which reflect surface irregularities of lower layers. An increase in the number of interconnect layers would result in poor film formation (or step coverage) over stepped configurations of thin films. Therefore, better multilayer interconnects need to have the improved step coverage and proper surface planarization. Furthermore, miniaturization of a photolithographic process necessitates a smaller depth of focus in a photolithographic optical system, and therefore a surface of the semiconductor device needs to be planarized such that the irregularities or steps on the surface of the semiconductor device will fall within the depth of focus.

Thus, in a process of manufacturing semiconductor devices, it becomes increasingly important to planarize a surface of the semiconductor device. One of the most important techniques in the surface planarization is chemical mechanical polishing (CMP). This chemical mechanical polishing is performed by bringing a wafer into sliding contact with a polishing surface of a polishing pad, while supplying a polishing liquid, containing abrasive particles such as silica ($SiO_2$) therein, onto the polishing surface to thereby polish the wafer.

A CMP apparatus is a polishing apparatus for chemically and mechanically polishing a wafer. Such a polishing apparatus, which is called CMP apparatus, includes a plurality of polishing tables and a plurality of polishing heads in order to perform multistage polishing of a wafer. A wafer is transported to polishing pads on polishing tables successively, and is polished on the polishing pads by polishing heads successively. For example, rough polishing of a wafer is performed as a first-stage polishing, and final polishing of the wafer is performed as a second-stage polishing.

The polishing apparatus is required to execute polishing recipes adapted to various polishing processes. To meet such requirement, high-performance polishing heads are used as the above-described plurality of polishing heads. More specifically, the polishing heads may each include a membrane for pressing a plurality of areas of a wafer independently, a retainer ring for pressing a polishing pad in an area around the wafer, etc.

However, such a high-performance polishing head has a complicated structure and has costly consumables (the membrane, the retainer ring, etc.), and therefore entails an increased maintenance cost and an increased running cost. Further, a frequency of maintenance work will also increase, resulting in a decrease in an operation rate of the apparatus.

The above polishing head has a plurality of pressure chambers formed by the membrane. The pressure chambers are capable of changing the internal pressures, so that the polishing head can apply different polishing pressures to a plurality of areas of a wafer. Therefore, the polishing head can polish the wafer while individually controlling polishing rates in the respective areas of the wafer.

However, the polishing head of this type cannot control the polishing rate in smaller areas than the pressure chambers. It is possible to perform finer control of a wafer profile by using more pressure chambers, but there is a limit on the number of pressure chambers that can be provided in the polishing head. Furthermore, the above-described polishing head is not able to positively control a polishing rate of a wafer at a boundary between the pressure chambers, and therefore the polishing rate may be low at the boundary between the pressure chambers.

With the progress toward higher integration of semiconductor devices and in order to increase the productivity in manufacturing of semiconductor devices, there has recently been a strong demand for higher-performance polishing apparatus. Performance characteristics as required for the polishing apparatus may include a planarization capability (a capability of Dishing/Erosion), a polishing rate (also called a removal rate), a uniformity of polishing-rate distribution over a wafer surface, a low defect level of polished wafer, a throughput of the polishing apparatus, etc.

The above-described performance characteristics often require contradictory polishing conditions. For example, polishing with a low pressure is typically desirable for enhancing the planarization capability, while polishing with a high pressure is desirable for increasing the polishing rate and the throughput. In addition, polishing using a high-hardness polishing pad is typically desirable for enhancing the planarization capability, while use of a low-hardness polishing pad is often desirable in order to achieve a low defect level of a polished wafer.

Japanese laid-open patent publication No. 2010-50436 discloses a polishing apparatus having multiple polishing heads. When such a polishing apparatus is used to perform multistage polishing, different polishing liquids and different polishing pads are used in accordance with types of intended polishing, such as rough polishing, final polishing, etc., thus resulting in basically different polishing-rate distributions. Therefore, polishing head control characteristics, which are necessary to improve the uniformity of polishing rate in a wafer surface, differ between rough polishing and final polishing.

SUMMARY OF THE INVENTION

According to an embodiment, there is provided a low-cost polishing apparatus which can perform multistage polishing of a substrate, such as a wafer.

According to embodiments, there are provided a polishing apparatus and a polishing method which can more precisely control a profile of a substrate, such as a wafer.

Further, according to an embodiment, there is provided a polishing apparatus provided with different types of polishing heads which can perform optimum multistage polishing under different polishing conditions.

Embodiments, which will be described below, relate to a polishing apparatus and a polishing method for polishing a substrate, such as a wafer, and more particularly to a polishing apparatus and a polishing method for polishing a substrate with use of various types of polishing heads having different structures.

In an embodiment, there is provided a polishing apparatus comprising: a plurality of polishing tables each for supporting a polishing pad; a plurality of polishing heads each configured to press a substrate against the polishing pad, the plurality of polishing heads having different structures; and a transporting device configured to transport the substrate to at least two of the plurality of polishing heads.

In an embodiment, the plurality of polishing heads include: at least one uniform-pressure polishing head configured to apply a uniform pressure to the substrate; and at least one multi-chamber polishing head capable of applying different pressures to the substrate.

In an embodiment, the at least one uniform-pressure polishing head is at least one of a rigid-body polishing head and a single-chamber polishing head. The rigid-body polishing head includes a rigid body having a flat surface in a circular shape, a substrate holding material in a circular shape attached to the flat surface and configured to press the substrate against the polishing pad, and a guide ring configured to hold the substrate without contact with the polishing pad. The single-chamber polishing head includes a carrier, a plate disposed below the carrier, a circular elastic membrane that forms a single pressure chamber under the plate, and a retainer ring secured to the carrier so as to surround the substrate and configured to press the polishing pad.

In an embodiment, the at least one multi-chamber polishing head is at least one of a first multi-chamber polishing head and a second multi-chamber polishing head. The first multi-chamber polishing head includes a carrier, a plate disposed below the carrier, a circular elastic membrane that forms a plurality of pressure chambers under the plate, and a retainer ring secured to the carrier so as to surround the substrate and configured to press the polishing pad. The second multi-chamber polishing head includes a carrier, a circular elastic membrane that forms a plurality of pressure chambers under the carrier, a retainer ring disposed so as to surround the substrate and configured to press the polishing pad, and an annular elastic membrane provided between the retainer ring and the carrier, an annular pressure chamber being formed in the annular elastic membrane.

In an embodiment, there is provided a polishing apparatus comprising: a plurality of polishing tables each for supporting a polishing pad; a first polishing head having a plurality of pressure chambers each configured to generate a pressure for pressing a substrate against the polishing pad; and a second polishing head having a plurality of pressure chambers each configured to generate a pressure for pressing the substrate against the polishing pad, an arrangement of the pressure chambers of the second polishing head being different from an arrangement of the pressure chambers of the first polishing head.

In an embodiment, the pressure chambers of the second polishing head are arranged at positions corresponding to positions of boundaries between the pressure chambers of the first polishing head.

In an embodiment, at least two of the pressure chambers of the second polishing head are arranged at positions corresponding to a position of one of the pressure chambers of the first polishing head.

In an embodiment, there is provided a polishing method comprising: pressing a substrate against a polishing pad by a first polishing head having a plurality of pressure chambers to polish the substrate; and then pressing the substrate against a polishing pad by a second polishing head having a plurality of pressure chambers, whose arrangement is different from an arrangement of the pressure chambers of the first polishing head, to polish the substrate.

According to the above-described embodiments, the plurality of polishing heads having different structures, i.e., having different initial costs and maintenance costs, are used. The use of the plurality of polishing heads having different structures can reduce a frequency of using a polishing head that requires a high maintenance cost. Therefore, the total maintenance cost of the polishing apparatus can be reduced.

According to the above-described embodiments, the first polishing head and the second polishing head, having the pressure chambers in different arrangements, are used. These two polishing heads can press different areas of a substrate against the polishing pad. In other words, the use of the two polishing heads, having the pressure chambers in different arrangements, can achieve the same effect as that achieved by use of a single polishing head having an increased number of pressure chambers. Therefore, a profile of a substrate can be controlled more precisely.

In an embodiment, there is provided a polishing apparatus for polishing a substrate, comprising: a first polishing head configured to press a substrate against a first polishing surface to polish a surface of the substrate, the first polishing head having a first elastic membrane which receives a pressure of a fluid to press the substrate against the first polishing surface; and a second polishing head configured to press a substrate against a second polishing surface to polish a surface of the substrate, the second polishing head having a second elastic membrane which receives a pressure of a fluid to press the substrate against the second polishing surface, and the second elastic membrane having a structure different from that of the first elastic membrane.

In an embodiment, the second polishing head is configured to further polish the substrate which has been polished by the first polishing head.

In an embodiment, the second elastic membrane has a hardness different from that of the first elastic membrane.

In an embodiment, the second elastic membrane has a circumferential wall whose shape is different from that of a circumferential wall of the first elastic membrane.

In an embodiment, the second elastic membrane has a contact portion which is to be brought into contact with the substrate, the contact portion having a thickness different from that of a contact portion, which is to be brought into contact with the substrate, of the first elastic membrane.

In an embodiment, the second elastic membrane has a substrate pressing surface whose area is different from that of a substrate pressing surface of the first elastic membrane.

In an embodiment, the second elastic membrane has a contact portion which is to be brought into contact with the substrate, the contact portion having an edge whose shape is different from that of an edge of a contact portion, which is to be brought into contact with the substrate, of the first elastic membrane.

In an embodiment, the polishing apparatus further comprises: a third polishing head configured to press a substrate against a third polishing surface to polish a surface of the substrate, the third polishing head having a third elastic membrane which receives a pressure of a fluid to press the substrate against the third polishing surface, the first elastic membrane having the same structure as that of the third elastic membrane; and a fourth polishing head configured to press a substrate against a fourth polishing surface to polish a surface of the substrate, the fourth polishing head having a fourth elastic membrane which receives a pressure of a fluid to press the substrate against the fourth polishing surface, the second elastic membrane having the same structure as that of the fourth elastic membrane.

In an embodiment, there is provided a polishing apparatus for polishing a substrate, comprising: a first polishing head configured to press a substrate against a first polishing surface to polish a surface of the substrate, the first polishing head having a first retainer ring disposed so as to surround the substrate and configured to press the first polishing surface; and a second polishing head configured to press a substrate against a second polishing surface to polish a surface of the substrate, the second polishing head having a second retainer ring disposed so as to surround the substrate and configured to press the second polishing surface, and the second retainer ring having a structure different from that of the first retainer ring.

In an embodiment, the second polishing head is configured to further polish the substrate which has been polished by the first polishing head.

In an embodiment, the first retainer ring has first grooves each extending from an inner circumferential surface to an outer circumferential surface of the first retainer ring, the second retainer ring has second grooves each extending from an inner circumferential surface to an outer circumferential surface of the second retainer ring, and the number of second grooves differs from the number of first grooves.

In an embodiment, the first retainer ring has first grooves each extending from an inner circumferential surface to an outer circumferential surface of the first retainer ring, the second retainer ring has second grooves each extending from an inner circumferential surface to an outer circumferential surface of the second retainer ring, and the second grooves have shape different from that of the first grooves.

In an embodiment, one of the first retainer ring and the second retainer ring has grooves each extending from an inner circumferential surface to an outer circumferential surface thereof, while the other of the first retainer ring and the second retainer ring has no groove that extends from an inner circumferential surface to an outer circumferential surface thereof.

In an embodiment, the first retainer ring or the second retainer ring has a tapered or oval edge portion.

In an embodiment, the second retainer ring has a width different from that of the first retainer ring.

In an embodiment, the first retainer ring or the second retainer ring comprises an inner retainer ring and an outer retainer ring.

In an embodiment, the second retainer ring is composed of a material different from that of the first retainer ring.

In an embodiment, the polishing apparatus further comprises: a third polishing head configured to press a substrate against a third polishing surface to polish a surface of the substrate, the third polishing head having a third retainer ring disposed so as to surround the substrate and configured to press the third polishing surface, the third retainer ring having the same structure as that of the first retainer ring; and a fourth polishing head configured to press a substrate against a fourth polishing surface to polish a surface of the substrate, the fourth polishing head having a fourth retainer ring disposed so as to surround the substrate and configured to press the fourth polishing surface, and the fourth retainer ring having the same structure as that of the second retainer ring.

The polishing apparatus according to the above-described embodiments can perform optimum multistage polishing with use of the different types of polishing heads. For example, a wafer is polished at a relatively high pressure with use of a polishing head having a high-hardness elastic membrane in the first-stage polishing, and the wafer is polished at a relatively low pressure with use of a polishing head having a low-hardness elastic membrane in the second-stage polishing. In another exemplary process, in order to obtain different wafer-edge profiles in the first-stage polishing and the second-stage polishing, the first-stage polishing and the second-stage polishing are performed using polishing heads whose elastic membranes have different shapes of edge portions. It is also possible to use a high-hardness polishing pad in the first-stage polishing and to use, in the second-stage polishing, a polishing head whose retainer ring has the smaller number of grooves than the retainer ring used in the first-stage polishing or has a tapered or oval edge portion. A width of a retainer ring affects rebound characteristics of a polishing pad and a flow of a polishing liquid being supplied to a wafer surface. Therefore, two polishing heads, provided with retainer rings having different widths, may be used to perform multistage polishing of a wafer.

BRIEF DESCRIPTION OF THE DRAWINGS

FIG. 9 is a schematic diagram showing an example of an arrangement of the pressure chambers of the first multi-chamber polishing head, and an example of an arrangement of the pressure chambers of the second multi-chamber polishing head;

FIG. 10 is a diagram showing an arrangement of the pressure chambers capable of performing a precise adjustment on a profile of a peripheral portion (or an edge portion) of a wafer;

FIG. 13 is a diagram illustrating an embodiment in which a rigid-body polishing head is used in a first polishing unit and a fourth polishing unit, and a second multi-chamber polishing head is used in a second polishing unit and a third polishing unit;

FIG. 14 is a diagram illustrating exemplary combinations of polishing heads to be selected in accordance with polishing targets, such as an amount of wafer to be polished, a demand for planarization of wafer surface, a demand for no defect such as scratch, etc.;

DESCRIPTION OF EMBODIMENTS

Figure 1:
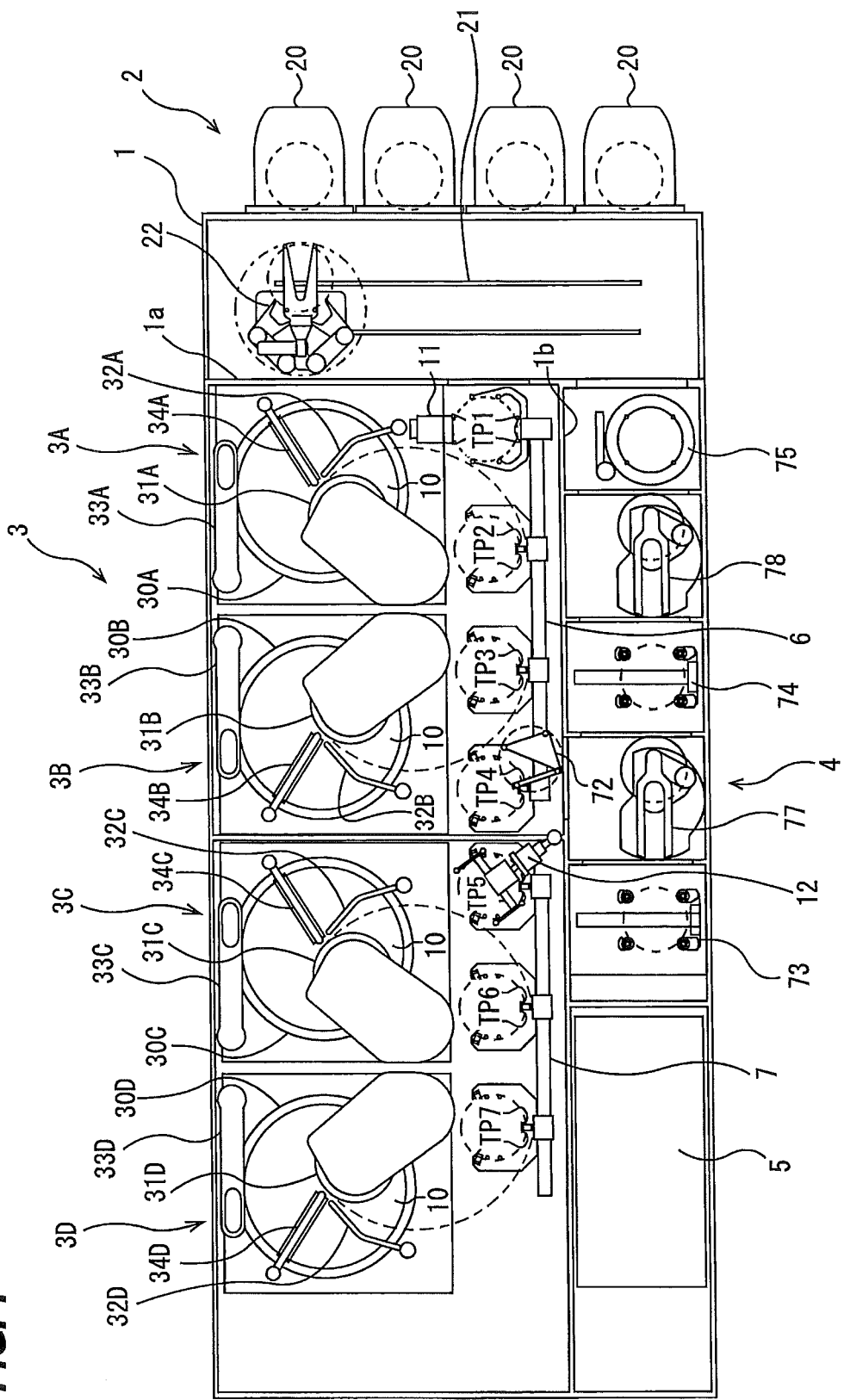
FIG. 1 is a diagram showing a polishing apparatus according to an embodiment.

Embodiments will be described with reference to the drawings. FIG. 1 is a view showing a polishing apparatus according to an embodiment. As shown in FIG. 1, this polishing apparatus has a housing 1 in approximately a rectangular shape. An interior space of the housing 1 is divided by partitions 1a and 1b into a load-unload section 2, a polishing section 3, and a cleaning section 4. The polishing apparatus includes an operation controller 5 configured to control wafer processing operations.

The load-unload section 2 has front load sections 20 on which substrate cassettes are placed, respectively. A plurality of wafers (substrates) are stored in each substrate cassette. The load-unload section 2 has a moving mechanism 21 extending along an arrangement direction of the front load sections 20. A transfer robot (or a loader) 22 is provided on the moving mechanism 21, so that the transfer robot 22 can move along the arrangement direction of the substrate cassettes. The transfer robot 22 moves on the moving mechanism 21 so as to be able to access the substrate cassettes mounted to the front load sections 20.

The polishing section 3 is an area where a wafer is polished. This polishing section 3 includes a first polishing unit 3A, a second polishing unit 3B, a third polishing unit 3C, and a fourth polishing unit 3D. As shown in FIG. 1, the first polishing unit 3A includes a first polishing table 30A to which a polishing pad 10, having a polishing surface, is attached, a polishing head 31A for holding a wafer and pressing the wafer against the polishing pad 10 on the first polishing table 30A so as to polish the wafer, a first polishing liquid supply nozzle 32A for supplying a polishing liquid (e.g., slurry) and a dressing liquid (e.g., pure water) onto the polishing pad 10, a first dresser 33A for dressing the polishing surface of the polishing pad 10, and a first atomizer 34A for ejecting a mixture of a liquid (e.g., pure water) and a gas (e.g., nitrogen gas) in an atomized state, onto the polishing surface.

Similarly, the second polishing unit 3B includes a second polishing table 30B to which a polishing pad 10 is attached, a polishing head 31B, a second polishing liquid supply nozzle 32B, a second dresser 33B, and a second atomizer 34B. The third polishing unit 3C includes a third polishing table 30C to which a polishing pad 10 is attached, a polishing head 31C, a third polishing liquid supply nozzle 32C, a third dresser 33C, and a third atomizer 34C. The fourth polishing unit 3D includes a fourth polishing table 30D to which a polishing pad 10 is attached, a polishing head 31D, a fourth polishing liquid supply nozzle 32D, a fourth dresser 33D, and a fourth atomizer 34D.

Figure 2:
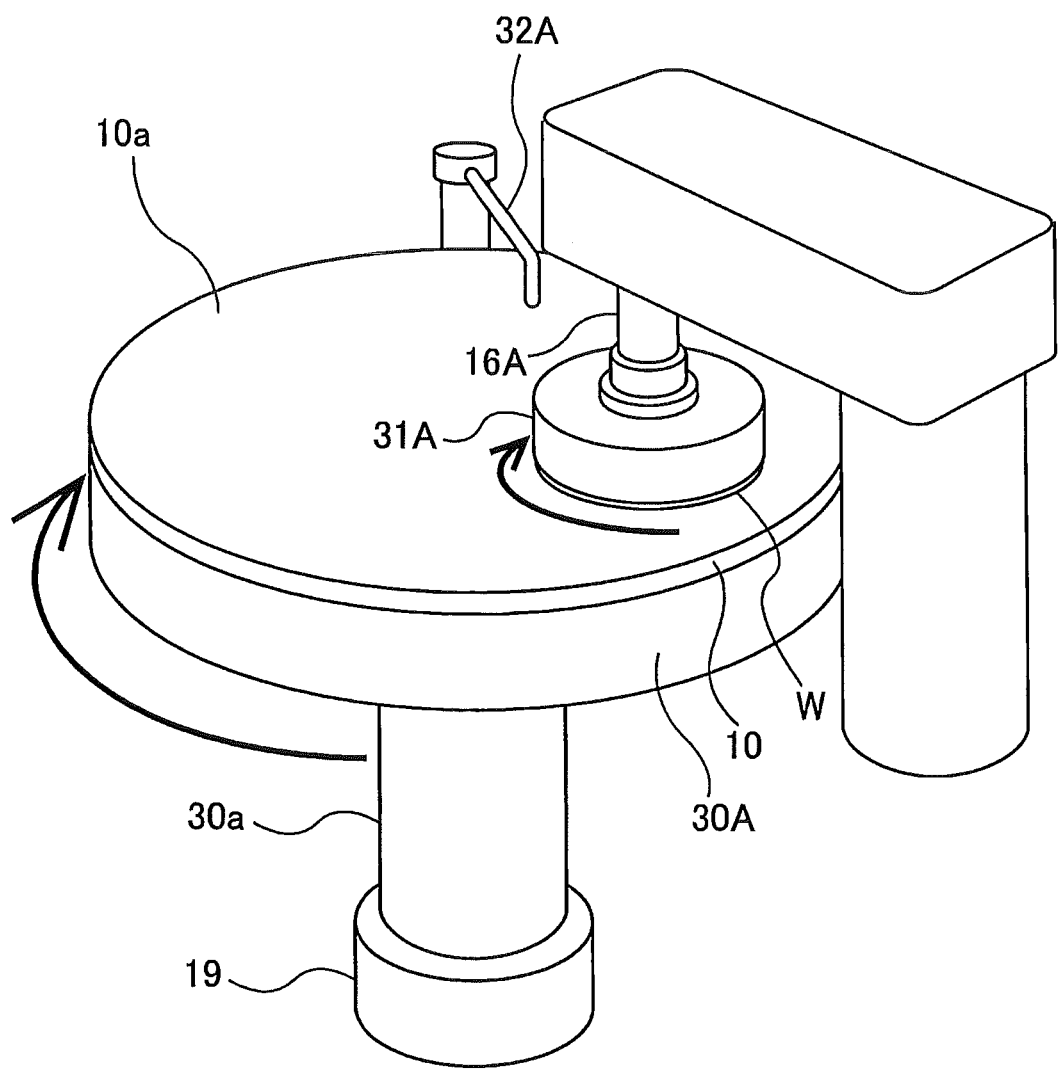
FIG. 2 is a schematic perspective view of a first polishing unit.

The four polishing heads 31A, 31B, 31C, and 31D have different structures as will be described later, while the first polishing unit 3A, the second polishing unit 3B, the third polishing unit 3C, and the fourth polishing unit 3D have basically the same configuration as a whole. Therefore, the first polishing unit 3A will be described below with reference to FIG. 2. FIG. 2 is a perspective view schematically showing the first polishing unit 3A. In FIG. 2, the dresser 33A and the atomizer 34A are omitted.

The polishing table 30A is coupled to a table motor 19 through a table shaft 30a, so that the polishing table 30A is rotated by the table motor 19 in a direction indicated by arrow. The table motor 19 is located below the polishing table 30A. The polishing pad 10 is attached to an upper surface of the polishing table 30A. The polishing pad 10 has an upper surface, which provides a polishing surface 10a for polishing a wafer W. The polishing head 31A is secured to a lower end of a head shaft 16A. The polishing head 31A is configured to be able to hold the wafer W on its lower surface by vacuum suction. The head shaft 16A is elevated and lowered by an elevating mechanism (not shown in FIG. 2).

Polishing of the wafer W is performed as follows. The polishing head 31A and the polishing table 30A are rotated in directions as indicated by arrows, while the polishing liquid (i.e., the slurry) is supplied onto the polishing pad 10 from the polishing liquid supply nozzle 32A. In this state, the polishing head 31A presses the wafer W against the polishing surface 10a of the polishing pad 10. The surface of the wafer W is polished by a mechanical action of abrasive grains contained in the polishing liquid and a chemical action of the polishing liquid. After polishing of the wafer W, dressing (or conditioning) of the polishing surface 10a is performed by the dresser 33A. Further, high-pressure fluid is supplied from the atomizer 34A onto the polishing surface 10a to remove polishing debris and the abrasive grains remaining on the polishing surface 10a.

Referring back to FIG. 1, a first linear transporter 6 is arranged adjacent to the first polishing unit 3A and the second polishing unit 3B. This first linear transporter 6 is configured to transport the wafer between four transfer positions (i.e., a first transfer position TP1, a second transfer position TP2, a third transfer position TP3, and a fourth transfer position TP4). A second linear transporter 7 is arranged adjacent to the third polishing unit 3C and the fourth polishing unit 3D. This second linear transporter 7 is configured to transport the wafer between three transfer positions (i.e., a fifth transfer position TP5, a sixth transfer position TP6, and a seventh transfer position TP7).

The wafer is transported to the polishing units 3A and 3B by the first linear transporter 6. The polishing head 31A of the first polishing unit 3A is moved between a position above the polishing table 30A and the second transfer position TP2 by the swinging motion of the polishing head 31A. Therefore, transferring of the wafer between the polishing head 31A and the first linear transporter 6 is performed at the second transfer position TP2.

Similarly, the polishing head 31B of the second polishing unit 3B is moved between a position above the polishing table 30B and the third transfer position TP3, and transferring of the wafer between the polishing head 31B and the first linear transporter 6 is performed at the third transfer position TP3. The polishing head 31C of the third polishing unit 3C is moved between a position above the polishing table 30C and the sixth transfer position TP6, and transferring of the wafer between the polishing head 31C and the second linear transporter 7 is performed at the sixth transfer position TP6. The polishing head 31D of the fourth polishing unit 3D is moved between a position above the polishing table 30D and the seventh transfer position TP7, and transferring of the wafer between the polishing head 31D and the second linear transporter 7 is performed at the seventh transfer position TP7.

A lifter 11 for receiving the wafer from the transfer robot 22 is provided adjacent to the first transfer position TP1. The wafer is transported from the transfer robot 22 to the first linear transporter 6 via the lifter 11. A shutter (not shown in the drawing) is provided on the partition 1a at a position between the lifter 11 and the transfer robot 22. When the wafer is to be transported, this shutter is opened to allow the transfer robot 22 to deliver the wafer to the lifter 11.

A swing transporter 12 is provided between the first linear transporter 6, the second linear transporter 7, and the cleaning section 4. Transporting of the wafer from the first linear transporter 6 to the second linear transporter 7 is performed by the swing transporter 12. The wafer is transported to the third polishing unit 3C and/or the fourth polishing unit 3D by the second linear transporter 7.

A buffer stage 72 for the wafer is disposed beside the swing transporter 12. This buffer stage 72 is mounted to a non-illustrated frame. As shown in FIG. 1, the buffer stage 72 is arranged adjacent to the first linear transporter 6 and located between the first linear transporter 6 and the cleaning section 4. The swing transporter 12 is configured to transport the wafer between the fourth transfer position TP4, the fifth transfer position TP5, and the buffer stage 72.

The wafer, placed on the buffer stage 72, is transported to the cleaning section 4 by a first transfer robot 77 of the cleaning section 4. As shown in FIG. 1, the cleaning section 4 includes a first cleaning unit 73 and a second cleaning unit 74 for cleaning the polished wafer with a cleaning liquid, and a drying unit 75 for drying the cleaned wafer. The first transfer robot 77 is configured to transport the wafer from the buffer stage 72 to the first cleaning unit 73 and further transport the wafer from the first cleaning unit 73 to the second cleaning unit 74. A second transfer robot 78 is arranged between the second cleaning unit 74 and the drying unit 75. This second transfer robot 78 is operable to transport the wafer from the second cleaning unit 74 to the drying unit 75.

Next, operations of the polishing apparatus will be described. The transfer robot 22 removes a wafer from the substrate cassette, and transports the wafer to the first linear transporter 6. The wafer is transported to at least two of the polishing units 3A to 3D via the first linear transporter 6 and/or the second linear transporter 7. The wafer is polished in at least two of the polishing units 3A to 3D.

The polished wafer is transported to the first cleaning unit 73 and the second cleaning unit 74 via the first linear transporter 6 and/or the second linear transporter 7, the swing transporter 12, and the transfer robot 77. The polished wafer is cleaned by the first cleaning unit 73 and the second cleaning unit 74 successively. Further, the cleaned wafer is transported by the transfer robot 78 to the drying unit 75, where the cleaned wafer is dried.

The dried wafer is removed from the drying unit 75 by the transfer robot 22, and then returned to the substrate cassette on the front load section 20. In this manner, a sequence of processes including polishing, cleaning, and drying is performed on the wafer.

The transfer robot 22, the first linear transporter 6, the second linear transporter 7, and the swing transporter 12 constitute a transporting device that transports a wafer to at least two of the polishing units 3A to 3D. Operation of this transporting device is controlled by the operation controller 5. The transporting device is configured to transport the wafer to at least two of the four polishing units 3A, 3B, 3C, and 3D in accordance with a predetermined transporting route.

Figure 3:
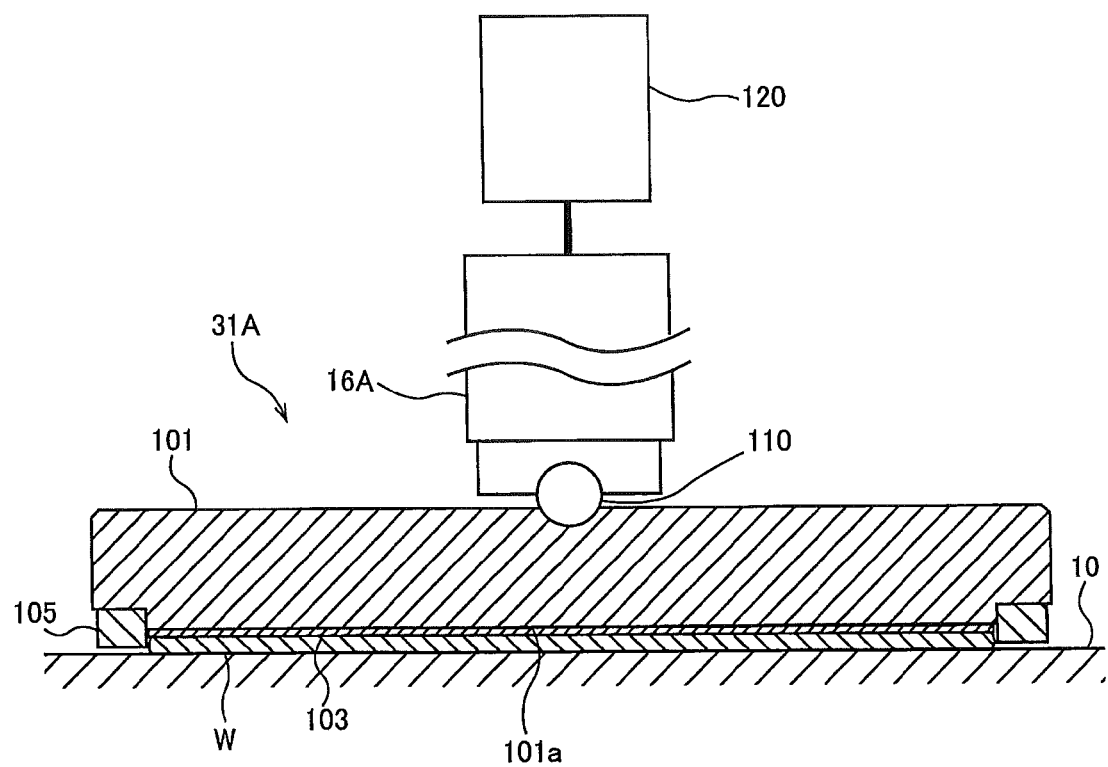
FIG. 3 is a cross-sectional view showing a polishing head of the first polishing unit.

The four polishing heads 31A, 31B, 31C, and 31D have different structures. The polishing heads 31A, 31B, 31C, and 31D will now be described. FIG. 3 is a cross-sectional view showing the polishing head 31A. The polishing head 31A includes a rigid body 101 having a circular flat surface 101a, a circular wafer holding material (or a substrate holding material) 103 attached to the flat surface 101a and used to press a wafer W against the polishing pad 10, and a guide ring 105 for holding the wafer W without contact with the polishing pad 10. The wafer holding material (substrate holding material) 103 is also called a backing film.

The rigid body 101 is coupled via a universal joint 110 to the lower end of the head shaft 16A. Accordingly, the entirety of the polishing head 31A can freely tilt with respect to the head shaft 16A. The head shaft 16A is coupled to a vertically-moving mechanism 120. This vertically-moving mechanism 120 is configured to elevate and lower the head shaft 16A and the polishing head 31A, and to generate a predetermined downward load. An air cylinder or a combination of a servo motor and a ball screw mechanism, for example, may be used as the vertically-moving mechanism 120.

The circular wafer holding material 103 is brought into contact with a back surface (i.e., a surface opposite to a surface to be polished) of the wafer W. When the vertically-moving mechanism 120 applies the downward load to the polishing head 31A through the head shaft 16A with the wafer holding material 103 in contact with the back surface of the wafer W, the polishing head 31A presses the surface, to be polished, of the wafer W against the polishing pad 10. The polishing pressure is transmitted from the flat surface 101a (lower surface) of the rigid body 101 to the wafer W through the wafer holding material 103. The polishing head 31A may be hereinafter sometimes referred to as rigid-body polishing head.

Figure 4:
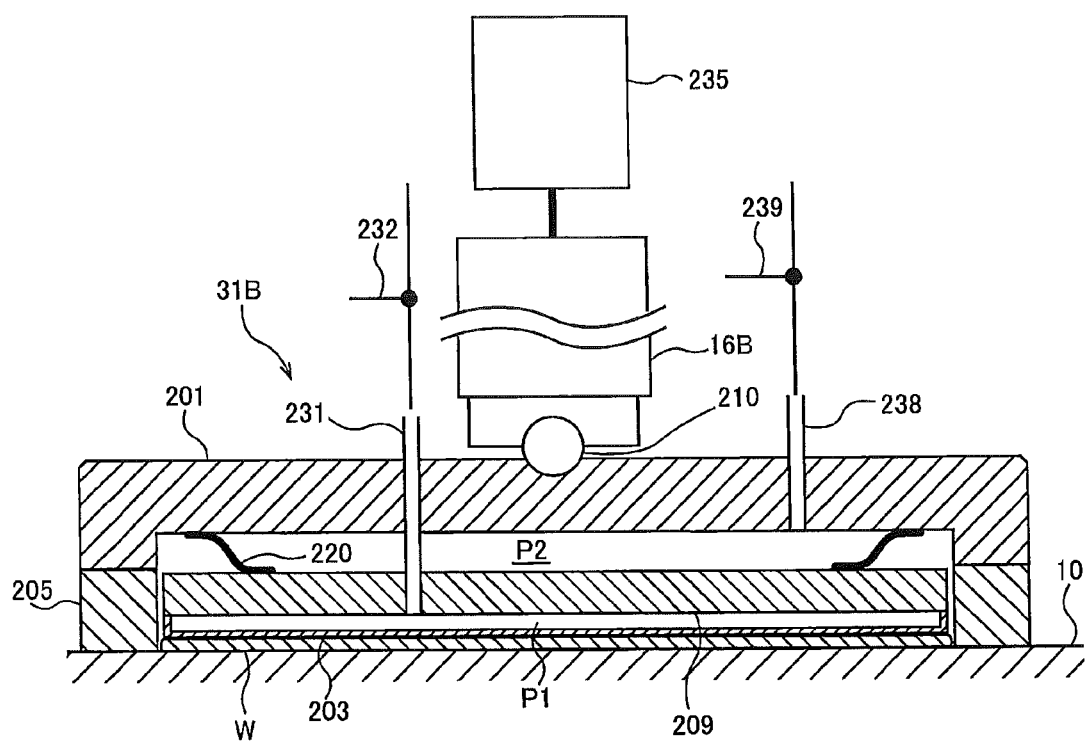
FIG. 4 is a cross-sectional view showing a polishing head of a second polishing unit.

FIG. 4 is a cross-sectional view showing the polishing head 31B. The polishing head 31B includes a disk-shaped carrier 201, a plate 209 disposed under the carrier 201, a circular flexible elastic membrane 203 that forms a single pressure chamber P1 under the plate 209, and a retainer ring 205 which is secured to the carrier 201 so as to surround a wafer W and which is to press the polishing pad 10. The elastic membrane 203 is attached to the plate 209, and the pressure chamber P1 is formed between the plate 209 and the elastic membrane 203. The pressure chamber P1 is coupled to a fluid line 231 so that a pressurized gas (e.g., pressurized air) having a regulated pressure is supplied through the fluid line 231 into the pressure chamber P1. A vacuum line 232 is coupled to the fluid line 231 so that negative pressure is created in the pressure chamber P1 by the vacuum line 232.

The retainer ring 205 is secured to the lower surface of the carrier 201. The carrier 201 is coupled via a universal joint 210 to a lower end of a head shaft 16B. Accordingly, the carrier 201 and the retainer ring 205 can freely tilt with respect to the head shaft 16B. The head shaft 16B is coupled to a vertically-moving mechanism 235. This vertically-moving mechanism 235 is configured to elevate and lower the head shaft 16B and the polishing head 31B, and to generate a predetermined downward load. An air cylinder or a combination of a servo motor and a ball screw mechanism, for example, may be used as the vertically-moving mechanism 235. When the vertically-moving mechanism 235 applies a downward load to the polishing head 31B through the head shaft 16B, the retainer ring 205 presses the polishing pad 10.

The carrier 201 is coupled to the plate 209 by an annular diaphragm 220, and a pressure chamber P2 is formed between the carrier 201 and the plate 209. The pressure chamber P2 is coupled to a fluid line 238 so that a pressurized gas (e.g., pressurized air) having a regulated pressure is supplied through the fluid line 238 into the pressure chamber P2. A vacuum line 239 is coupled to the fluid line 238 so that negative pressure is created in the pressure chamber P2 by the vacuum line 239. The entirety of the plate 209 and the elastic membrane 203 can move in the vertical directions in accordance with a change in the pressure in the pressure chamber P2.

As can be seen from FIG. 4, the plate 209, the elastic membrane 203, and the wafer W can flexibly tilt with respect to the carrier 201 and the retainer ring 205, because the plate 209 is coupled to the carrier 201 via the diaphragm 220. The lower surface of the elastic membrane (or membrane) 203 is brought into contact with the back surface (i.e., the surface opposite to the to-be-polished surface) of the wafer W, and the elastic membrane 203 presses the to-be-polished surface of the wafer W against the polishing pad 10. The polishing pressure is generated by the pressure developed in the pressure chamber P1, and is applied from the elastic membrane 203 to the wafer W. The polishing head 31B may be hereinafter sometimes referred to as single-chamber polishing head.

The above-described rigid-body polishing head 31A and single-chamber polishing head 31B are uniform-pressure polishing heads which apply a uniform polishing pressure to the entire surface of the wafer W. The uniform-pressure polishing heads 31A, 31B have a relatively simple structure, and therefore entail low maintenance costs. For example, in the case of the rigid-body polishing head 31A, the guide ring 105 does not touch the polishing pad 10, and therefore does not wear. Moreover, the polishing head 31A is inexpensive because of its simple construction using the wafer holding material 103. In the case of the polishing head 31B, both the initial cost and maintenance cost are low because of the few pressure chambers.

Figure 5:
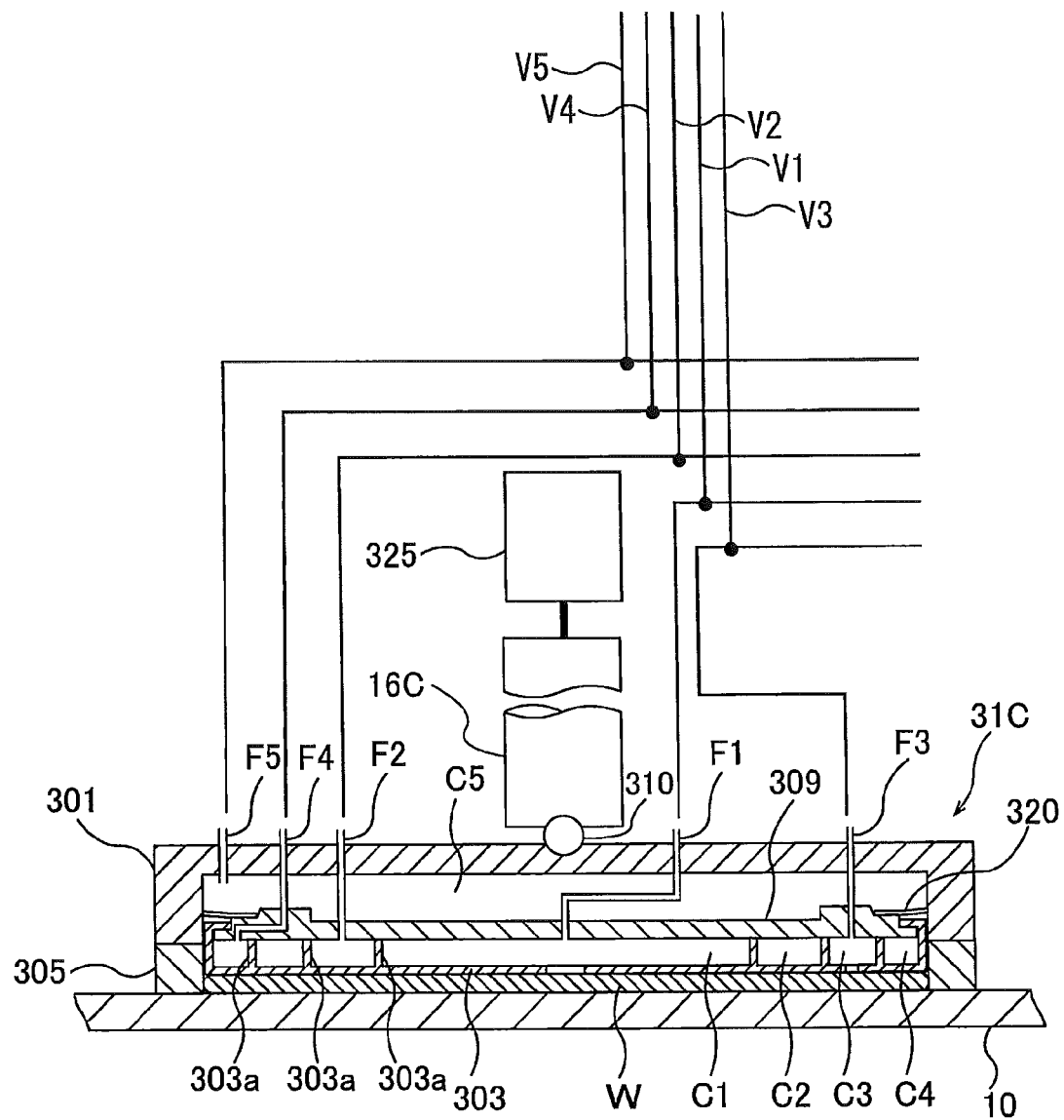
FIG. 5 is a cross-sectional view showing a polishing head of a third polishing unit.

FIG. 5 is a cross-sectional view showing the polishing head 31C. The polishing head 31C includes a disk-shaped carrier 301, a plate 309 disposed below the carrier 301, a circular flexible elastic membrane (or membrane) 303 that forms a plurality of pressure chambers C1, C2, C3, C4 under the plate 309, and a retainer ring 305 which is secured to the carrier 301 such that it surrounds a wafer W and which is to press the polishing pad 10. The elastic membrane 303 is attached to the plate 309, and the pressure chambers C1, C2, C3, C4 are formed between the elastic membrane 303 and the plate 309.

The elastic membrane 303 has a plurality of annular partitions 303a by which the pressure chambers C1, C2, C3, C4 are isolated from each other. The central pressure chamber C1 has a circular shape, while the other pressure chambers C2, C3, C4 each have an annular shape. The pressure chambers C1, C2, C3, C4 are arranged concentrically. There is no particular limitation on the number of pressure chambers of the polishing head 31C, so long as the polishing head 31C has at least two pressure chambers.

The pressure chambers C1, C2, C3, C4 are coupled to fluid lines F1, F2, F3, F4 so that a pressurized gas (e.g., pressurized air) having regulated pressures is supplied through the fluid lines F1, F2, F3, F4 into the pressure chambers C1, C2, C3, C4. Vacuum lines V1, V2, V3, V4 are coupled to the fluid lines F1, F2, F3, F4 so that negative pressure is created in the pressure chambers C1, C2, C3, C4 by the vacuum lines V1, V2, V3, V4. The internal pressures of the pressure chambers C1, C2, C3, C4 can be changed independently of each other, so that the pressure chambers C1, C2, C3, C4 can independently regulate polishing pressures on the four corresponding areas of the wafer W, i.e., a central portion, an inner intermediate portion, an outer intermediate portion, and a peripheral portion.

The carrier 301 and the plate 309 are coupled by an annular diaphragm 320, and a pressure chamber C5 is formed between the carrier 301 and the plate 309. The pressure chamber C5 is coupled to a fluid line F5 so that a pressurized gas (e.g., pressurized air) having a regulated pressure is supplied through the fluid line F5 into the pressure chamber C5. A vacuum line V5 is coupled to the fluid line F5 so that negative pressure is created in the pressure chamber C5 by the vacuum line V5. The entirety of the plate 309 and the elastic membrane 303 can move in the vertical directions in accordance with a change in the pressure in the pressure chamber C5.

The retainer ring 305 is secured to the lower surface of the carrier 301. The carrier 301 is coupled via a universal joint 310 to a lower end of a head shaft 16C. Accordingly, the carrier 301 and the retainer ring 305 can freely tilt with respect to the head shaft 16C. As can be seen from FIG. 5, the plate 309, the elastic membrane 303, and the wafer W can flexibly tilt with respect to the carrier 301 and the retainer ring 305 because the plate 309 is coupled to the carrier 301 via the diaphragm 320.

The head shaft 16C is coupled to a vertically-moving mechanism 325. This vertically-moving mechanism 325 is configured to elevate and lower the head shaft 16C and the polishing head 31C, and to generate a predetermined downward load. An air cylinder or a combination of a servo motor and a ball screw mechanism, for example, may be used as the vertically-moving mechanism 325. When the vertically-moving mechanism 325 applies a downward load to the polishing head 31C through the head shaft 16C, the retainer ring 305 presses the polishing pad 10. During polishing of the wafer W, the elastic membrane 303 presses the wafer W against the polishing pad 10 while the retainer ring 305 presses the polishing pad 10 in an area around the wafer W. The polishing head 31C may be hereinafter sometimes referred to as first multi-chamber polishing head.

Figure 6:
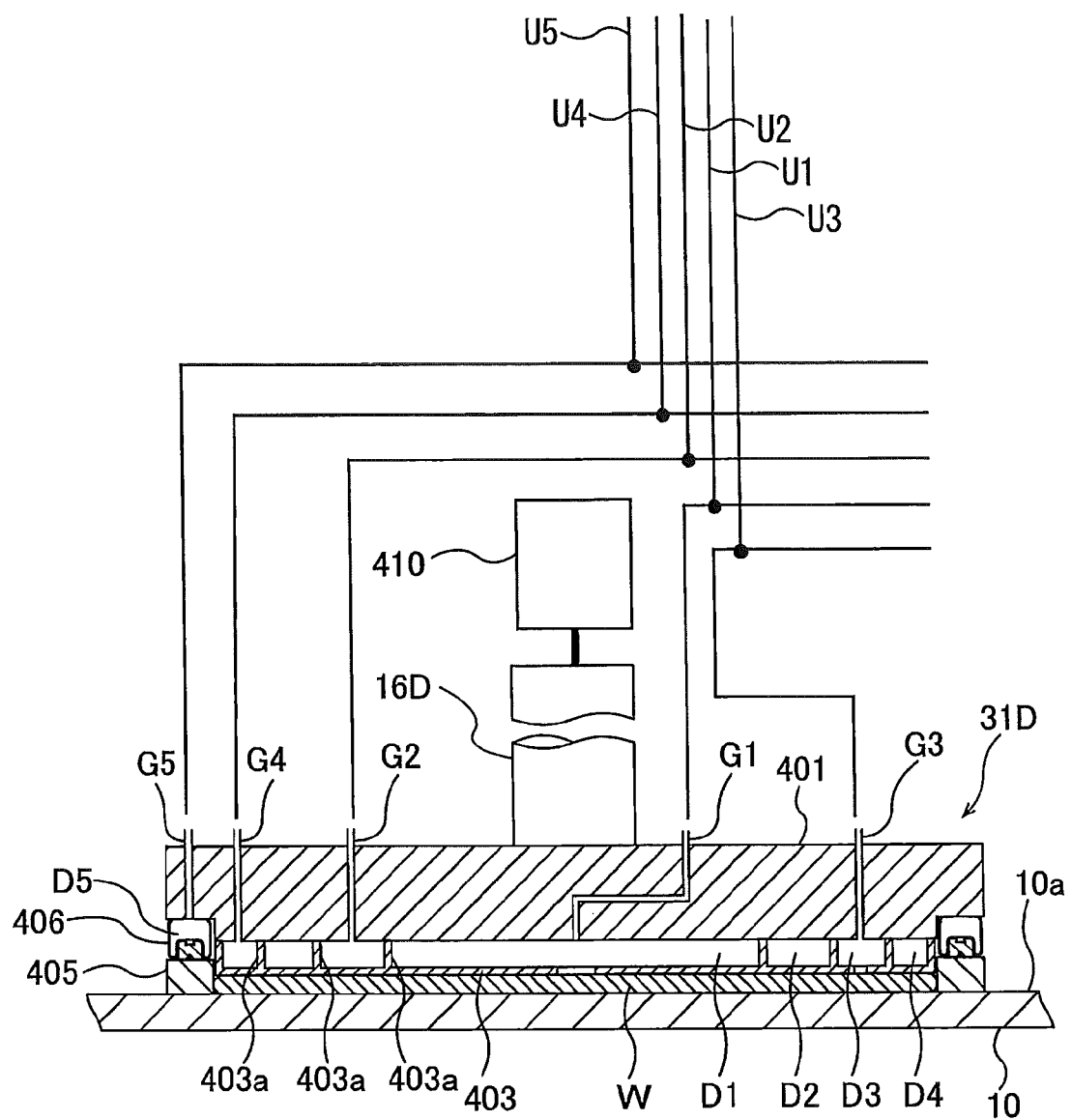
FIG. 6 is a cross-sectional view showing a polishing head of a fourth polishing unit.

FIG. 6 is a cross-sectional view showing the polishing head 31D. The polishing head 31D includes a disk-shaped carrier 401, a circular flexible elastic membrane (or membrane) 403 that forms a plurality of pressure chambers D1, D2, D3, D4 under the carrier 401, and a retainer ring 405 which is disposed such that it surrounds a wafer W and which is to press the polishing pad 10. The pressure chambers D1, D2, D3, D4 are formed between the elastic membrane 403 and a lower surface of the carrier 401.

The elastic membrane 403 has a plurality of annular partitions 403a by which the pressure chambers D1, D2, D3, D4 are isolated from each other. The central pressure chamber D1 has a circular shape, while the other pressure chambers D2, D3, D4 each have an annular shape. The pressure chambers D1, D2, D3, D4 are arranged concentrically. There is no particular limitation on the number of pressure chambers of the polishing head 31D, so long as the polishing head 31D has at least two pressure chambers.

The pressure chambers D1, D2, D3, D4 are coupled to fluid lines G1, G2, G3, G4 so that a pressurized gas (e.g., pressurized air) having regulated pressures is supplied through the fluid lines G1, G2, G3, G4 into the pressure chambers D1, D2, D3, D4. Vacuum lines U1, U2, U3, U4 are coupled to the fluid lines G1, G2, G3, G4 so that negative pressure is created in the pressure chambers D1, D2, D3, D4 by the vacuum lines U1, U2, U3, U4. The internal pressures of the pressure chambers D1, D2, D3, D4 can be changed independently of each other, so that the pressure chambers D1, D2, D3, D4 can independently regulate polishing pressures on the four corresponding areas of the wafer W, i.e., a central portion, an inner intermediate portion, an outer intermediate portion and a peripheral portion.

An annular elastic membrane 406 is disposed between the retainer ring 405 and the carrier 401. An annular pressure chamber D5 is formed in the elastic membrane 406. The pressure chamber D5 is coupled to a fluid line G5 so that a pressurized gas (e.g., pressurized air) having a regulated pressure is supplied through the fluid line G5 into the pressure chamber D5. A vacuum line U5 is coupled to the fluid line G5 so that negative pressure is created in the pressure chamber D5 by the vacuum line U5. The entire retainer ring 405 can move in the vertical directions in accordance with a change in the pressure in the pressure chamber D5. The pressure in the pressure chamber D5 acts on the retainer ring 405, which can directly press the polishing pad 10 independently of the elastic membrane (or membrane) 403. During polishing of the wafer W, the elastic membrane 403 presses the wafer W against the polishing pad 10 while the retainer ring 405 presses the polishing pad 10 in an area around the wafer W.

The carrier 401 is fixed to a lower end of a head shaft 16D. Accordingly, the carrier 401 and the retainer ring 405 cannot tilt with respect to the head shaft 16D. The head shaft 16D is coupled to a vertically-moving mechanism 410. The vertically-moving mechanism 410 is configured to elevate and lower the head shaft 16D and the polishing head 31D, and to locate the polishing head 31D at a predetermined height. A combination of a servo motor and a ball screw mechanism may be used as the vertically-moving mechanism 410 which functions as a polishing head positioning mechanism. The height of the polishing head 31D herein refers to the height from the polishing surface (upper surface) 10a of the polishing pad 10.

After positioning of the polishing head 31D at a predetermined height is performed by means of the vertically-moving mechanism 410, the pressurized gas is supplied to the pressure chambers D1 to D5. During polishing of the wafer W, the elastic membrane 403 receives the pressures in the pressure chambers D1 to D4 and presses the wafer W against the polishing pad 10, and the retainer ring 405 receives the pressure in the pressure chamber D5 and presses the polishing pad 10. The polishing head 31D will be hereinafter sometimes referred to as second multi-chamber polishing head.

While the above-described first multi-chamber polishing head 31C and second multi-chamber polishing head 31D each have a complicated construction, these polishing heads 31C, 31D are superior to the above-described uniform-pressure polishing heads 31A, 31B in that the polishing heads 31C, 31D can control polishing of a wafer W with precision. However, the elastic membranes 303, 403 of the multi-chamber polishing heads 31C, 31D are costly because the multi-chamber polishing heads 31C, 31D include the plurality of pressure chambers. Furthermore, the complicated constructions of the multi-chamber polishing heads 31C, 31D entail high maintenance costs. The polishing apparatus of this embodiment includes not only the high-performance multi-chamber polishing heads 31C, 31D, but also the uniform-pressure polishing heads 31A, 31B which have low initial cost and maintenance cost. Therefore, the cost of the entire polishing apparatus and the cost for processing of a wafer W can be reduced.

In addition, a life of a polishing head can increase and the maintenance cost can be reduced by selecting a polishing head according to the type of processing of a wafer W. The polishing heads 31A, 31B shown in FIGS. 3 and 4 are preferably used in rough polishing and final polishing of a wafer W. In rough polishing of a wafer W, the wafer W is polished at a high polishing rate (or a high removal rate). In such rough polishing, the retainer ring wears fast. The use of the polishing heads 31A, 31B in rough polishing can decrease the frequency of use of the polishing heads 31C, 31D. Accordingly, the frequency of maintenance of the polishing heads 31C, 31D that entail high maintenance costs can be decreased, whereby the total maintenance cost can be reduced. The rigid-body polishing head 31A shown in FIG. 3 is especially suited for final polishing of a wafer W. This is because the guide ring 105 does not touch the polishing pad 10, and therefore no wear particles of the guide ring 105 are produced during polishing of a wafer W.

There is usually no need to perform profile control of a wafer in final polishing of the wafer. Therefore, there is no need to use the polishing heads 31C, 31D having the plurality of pressure chambers capable of controlling the wafer profile. The polishing heads 31A, 31B are therefore used in final polishing, so that the frequency of maintenance on the polishing heads 31C, 31D can be decreased and the total maintenance cost can be reduced.

Figure 7:
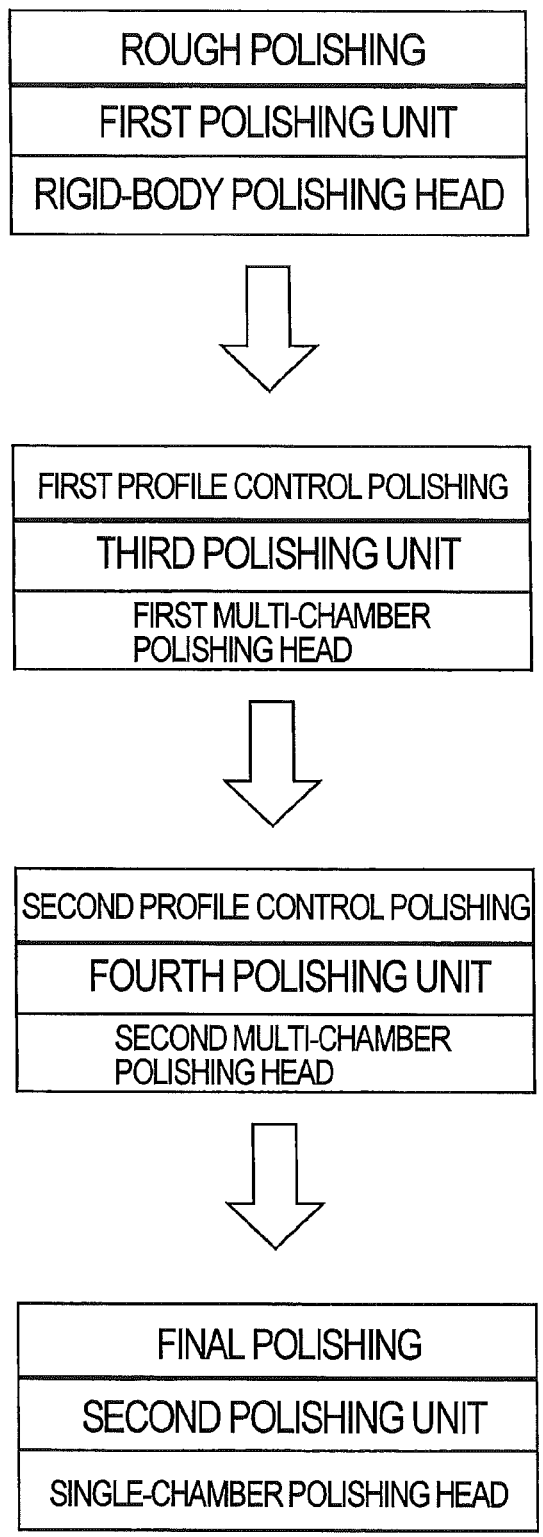
FIG. 7 is a diagram illustrating a process including the steps of rough polishing of a wafer, first profile control polishing of the wafer, second profile control polishing of the wafer, and final polishing of the wafer, performed in this order with use of four polishing heads.

An exemplary polishing process which involves polishing a wafer with use of at least two of the four different types of polishing heads 31A, 31B, 31C, 31D will now be described with reference to FIG. 7. FIG. 7 is a diagram illustrating the exemplary polishing process comprising rough polishing of a wafer, first profile control polishing of the wafer, second profile control polishing of the wafer, and final polishing of the wafer, performed in this order with use of the four polishing heads 31A, 31B, 31C, 31D. In this polishing process a wafer is transported to the first polishing unit 3A, the third polishing unit 3C, the fourth polishing unit 3D and the second polishing unit 3B in this order. Rough polishing of the wafer is performed with use of the polishing head 31A in the first polishing unit 3A, first profile control polishing of the wafer is performed with use of the polishing head 31C in the third polishing unit 3C, second profile control polishing of the wafer is performed with use of the polishing head 31D in the fourth polishing unit 3D, and final polishing of the wafer is performed with use of the polishing head 31B in the second polishing unit 3B.

The second profile control polishing is performed for fine correction of the wafer profile obtained by the first profile control polishing. In order to ensure the effect of the second profile control polishing, the arrangement of the pressure chambers of the second multi-chamber polishing head 31D preferably differs from the arrangement of the pressure chambers of the first multi-chamber polishing head 31C. This is because the pressure chambers D1 to D4 of the polishing head 31D are to press those portions of a wafer to which the pressures in the pressure chambers C1 to C4 of the polishing head 31C are not fully applied. This will now be described with reference to FIGS. 8A and 8B.

Figure 8A:
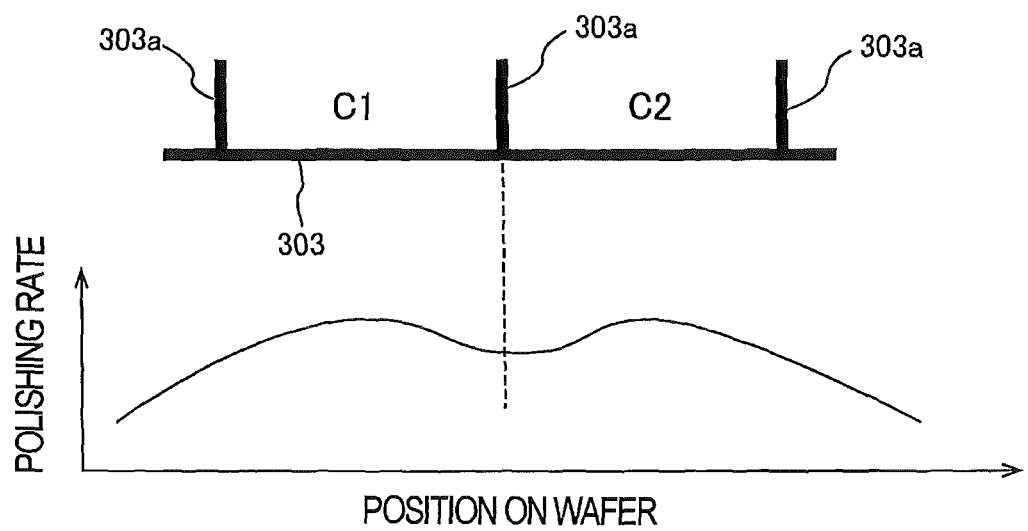
FIG. 8A is a schematic diagram showing part of pressure chambers of a first multi-chamber polishing head and corresponding part of a profile of a wafer.
Figure 8B:
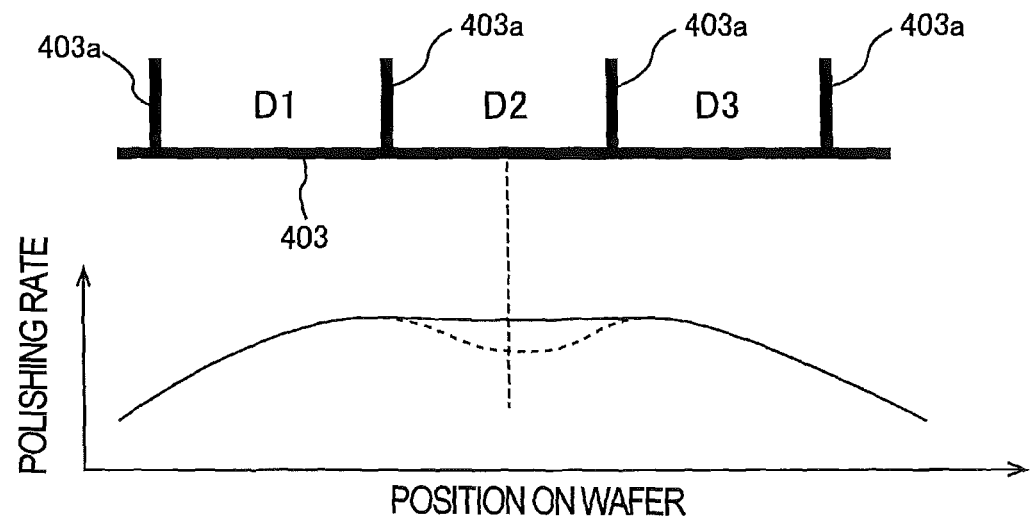
FIG. 8B is a schematic diagram showing part of pressure chambers of a second multi-chamber polishing head and corresponding part of a profile of a wafer.

FIG. 8A is a schematic diagram showing part of the pressure chambers C1 to C4 of the first multi-chamber polishing head 31C and the corresponding part of a profile of a wafer. As shown in FIG. 8A, the pressure chambers C1, C2 are separated by the partition 303a of the elastic membrane 303. This partition 303a prevents the pressures in the pressure chambers C1, C2 from being fully applied to the wafer. As a result, the polishing rate of the wafer is lower at a position corresponding to the partition 303a (i.e., the boundary between the pressure chambers C1, C2). In order to improve such a local decrease in the polishing rate, the pressure chamber D2 of the polishing head 31D is located at a position corresponding to the position of the boundary between the pressure chambers C1, C2 of the polishing head 31C, as shown in FIG. 8B. With these arrangements, the pressure in the pressure chamber D2 of the polishing head 31D can be applied to the portion of the wafer that has previously been polished at a locally low polishing rate, thereby increasing the polishing rate at that portion of the wafer.

FIG. 9 is a schematic diagram showing an example of the arrangement of the pressure chambers C1, C2, C3, C4 of the first multi-chamber polishing head 31C, and an example of the arrangement of the pressure chambers D1, D2, D3, D4 of the second multi-chamber polishing head 31D. As shown in FIG. 9, the arrangement of the pressure chambers of the first multi-chamber polishing head 31C differs from the arrangement of the pressure chambers of the second multi-chamber polishing head 31D. Specifically, the pressure chambers D1, D2, D3, D4 of the second multi-chamber polishing head 31D are arranged at positions corresponding to the boundaries between the pressure chambers C1, C2, C3, C4 of the first multi-chamber polishing head 31C. Because of the difference in the arrangement of the pressure chambers, one of the two polishing heads 31C, 31D can perform polishing for correction or fine adjustment of a wafer profile.

The two polishing heads 31C, 31D can press different areas of a wafer against the respective polishing pads 10. Thus, the use of the two polishing heads 31C, 31D, having the pressure chambers in different arrangements, can achieve substantially the same effect as that achieved by using a single polishing head having an increased number of pressure chambers. The profile of the wafer can therefore be controlled more precisely.

Figure 11:
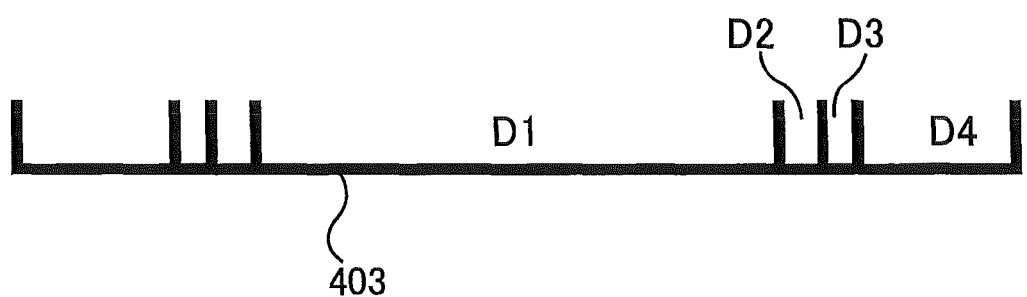
FIG. 11 is a diagram showing an arrangement of the pressure chambers capable of performing a precise adjustment on a profile of an intermediate portion of a wafer.
Figure 12:
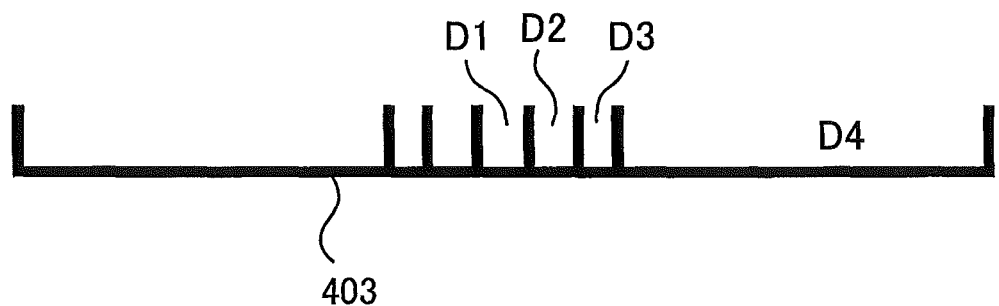
FIG. 12 is a diagram showing an arrangement of the pressure chambers capable of performing a precise adjustment on a profile of a central portion of a wafer.

In order to control a profile of a wafer more precisely in a particular area of the wafer, the pressure chambers D1, D2, D3, D4 may be arranged densely in an area corresponding to that particular area of the wafer. FIG. 10 shows the arrangement of the pressure chambers D1, D2, D3, D4 which is capable of performing a precise adjustment of a profile of a peripheral portion (or an edge portion) of a wafer, FIG. 11 shows the arrangement of the pressure chambers D1, D2, D3, D4 which is capable of performing a precise adjustment of a profile of an intermediate portion of a wafer, and FIG. 12 shows the arrangement of the pressure chambers D1, D2, D3, D4 which is capable of performing a precise adjustment of a profile of a central portion of a wafer. As will be appreciated from FIGS. 10 through 12, at least two of the pressure chambers D1, D2, D3, D4 are arranged at positions corresponding to a position of one of the pressure chambers C1, C2, C3, C4.

The above-described combination and arrangement of the four different types of polishing heads 31A, 31B, 31C, 31D may be arbitrarily changed. For example, as shown in FIG. 13, it is possible to dispose the rigid-body polishing head 31A in the first polishing unit 3A, the second multi-chamber polishing head 31D in the second polishing unit 3B, the second multi-chamber polishing head 31D in the third polishing unit 3C, and the rigid-body polishing head 31A in the fourth polishing unit 3D. Thus, in this embodiment, the two rigid-body polishing heads 31A and the two second multi-chamber polishing heads 31D are used, while the single-chamber polishing head 31B and the first multi-chamber polishing head 31C are not used. The arrangement of the pressure chambers of one of the two second multi-chamber polishing heads 31D differs from the arrangement of the pressure chambers of the other second multi-chamber polishing head 31D as shown in FIG. 9. Therefore, the two second multi-chamber polishing heads 31D can perform polishing for positive control (or production) of a profile of a wafer and polishing for fine adjustment of the profile of the wafer.

One or both of the two rigid-body polishing heads 31A used in the embodiment of FIG. 13 may be replaced with the single-chamber polishing head(s) 31B. One or both of the two second multi-chamber polishing heads 31D used in the embodiment of FIG. 13 may be replaced with the first multi-chamber polishing head(s) 31C.

Examples of polishing of a wafer using the combination of polishing heads shown in FIG. 13 will now be described. FIG. 14 is a diagram illustrating exemplary combinations of polishing heads to be selected in accordance with polishing targets, such as an amount of polishing of a wafer, a demand for planarization of a wafer surface, a demand for no defect, e.g., scratch, etc. Example 1 shown in FIG. 14 represents an exemplary selection of polishing heads in a case of a large amount of polishing of a wafer, a high demand for planarization of a wafer surface and a high demand for no defect. In this example 1, all of the four polishing heads of the four polishing units 3A, 3B, 3C, 3D are used to polish a wafer.

Example 2 represents an exemplary selection of polishing heads in a case of a small amount of polishing of a wafer, a high demand for planarization of a wafer surface and a high demand for no defect. In this example 2, the rigid-body polishing head of the first polishing unit 3A is not used, while the second multi-chamber polishing head of the second polishing unit 3B, the second multi-chamber polishing head of the third polishing unit 3C, and the rigid-body polishing head of the fourth polishing unit 3D are used. Example 3 represents an exemplary selection of polishing heads in a case of a small amount of polishing of a wafer, a low demand for planarization of a wafer surface and a high demand for no defect. In this Example 3, the rigid-body polishing head of the first polishing unit 3A and the second multi-chamber polishing head of the third polishing unit 3C are not used, while the second multi-chamber polishing head of the second polishing unit 3B and the rigid-body polishing head of the fourth polishing unit 3D are used. Example 4 represents an exemplary selection of polishing heads in a case of a large amount of polishing of a wafer, a low demand for planarization of a wafer surface, and a low demand for no defect. In this example 4, the second multi-chamber polishing head of the third polishing unit 3C and the rigid-body polishing head of the fourth polishing unit 3D are not used, while the rigid-body polishing head of the first polishing unit 3A and the second multi-chamber polishing head of the second polishing unit 3B are used. Example 5 represents an exemplary selection of polishing heads in a case of a small amount of polishing of a wafer, a high demand for planarization of a wafer surface, and a low demand for no defect. In this example 5, the rigid-body polishing heads of the first polishing unit 3A and the fourth polishing unit 3D are not used, while the second multi-chamber polishing heads of the second polishing unit 3B and the third polishing unit 3C are used.

Another embodiment will now be described. In this embodiment the second multi-chamber polishing head shown in FIG. 6 is used in each of the first polishing unit 3A, the second polishing unit 3B, the third polishing unit 3C, and the fourth polishing unit 3D. The polishing head shown in FIG. 4 or the polishing head shown in FIG. 5 may be used instead of the polishing head shown in FIG. 6.

The first polishing head 31A, the second polishing head 31B, the third polishing head 31C and the fourth polishing head 31D, which are the second multi-chamber polishing heads, have basically the same construction; however, two of the four polishing heads 31A to 31D each have the elastic membrane 403 whose structure differs from the elastic membranes 403 of the other two polishing heads. For example, the first polishing head 31A and the third polishing head 31C have the elastic membranes 403 of the same structure, and the second polishing head 31B and the fourth polishing head 31D have the elastic membranes 403 of the same structure. The structure of the elastic membranes 403 of the first polishing head 31A and the third polishing head 31C differs from that of the elastic membranes 403 of the second polishing head 31B and the fourth polishing head 31D. In this specification, the structure of the elastic membrane 403 includes at least size, hardness and shape of the elastic membrane 403.

Two of the four polishing heads 31A to 31D may each have the retainer ring 405 (see FIG. 6) whose structure differs from the retainer rings 405 of the other two polishing heads. For example, the first polishing head 31A and the third polishing head 31C have the retainer rings 405 of the same structure, and the second polishing head 31B and the fourth polishing head 31D have the retainer rings 405 of the same structure. The structure of the retainer rings 405 of the first polishing head 31A and the third polishing head 31C differs from that of the retainer rings 405 of the second polishing head 31B and the fourth polishing head 31D. In this specification, the structure of the retainer ring 405 includes at least shape and material of the retainer ring 405, and shape and the number of grooves (described later) formed in the bottom of the retainer ring 405.

The following problem can arise when the polishing pressure is changed between a first-stage polishing and a second-stage polishing. In high-pressure polishing, the elastic membrane 403 may be deformed greatly or the elastic membrane 403 may be twisted. As a result, a pressing force may not be applied uniformly to a wafer. Therefore, it is desirable that a polishing head for performing the high-pressure polishing use an elastic membrane having a higher hardness than the elastic membranes of the other polishing heads. The elastic membrane having a high hardness is less likely to be deformed or twisted, and therefore can apply a uniform pressing force to a wafer.

The elastic membrane 403 has, in its lower surface, holes for attracting a wafer by suction. In particular, when a vacuum is created in the pressure chamber D3 shown in FIG. 6, a wafer is attracted to the elastic membrane 403 through the holes. If the elastic membrane 403 is deformed or twisted during polishing of the wafer, the pressurized fluid can leak through the holes. In the event of leakage of the pressurized fluid, the elastic membrane 403 cannot press the wafer at an appropriate pressing force. This may result in a decrease in the polishing rate or variation in the polishing rate in the wafer surface, leading to a significant decrease in the productivity of the polishing apparatus. The use of the high-hardness elastic membrane 403 is effective also in preventing the leakage of the pressurized fluid from the elastic membrane 403 during polishing.

The hardness of the elastic membrane 403 also affects extension of the elastic membrane 403 in the vertical direction. Thus, a difference in the hardness of the elastic membrane of the polishing head may produce a difference in a polishing profile of a peripheral portion of a wafer. In general, an elastic membrane having a high hardness is not stretchy in its edge portion. Therefore, use of a high-hardness elastic membrane can result in a low pressure on a peripheral portion of a wafer, thus enabling a low polishing rate of the peripheral portion of the wafer. In contrast, an elastic membrane having a relatively low hardness is stretchy in its edge portion. Therefore, use of a low-hardness elastic membrane can result in a relatively high pressure on a peripheral portion of a wafer, thus increasing a pressing force applied to the peripheral portion of the wafer, as compared to the use of the high-hardness elastic membrane. Therefore, the use of the low-hardness elastic membrane can increase the polishing rate of the peripheral portion of the wafer, as compared to the use of the high-hardness elastic membrane.

Because a low-hardness elastic membrane is stretchy as compared to a high-hardness elastic membrane, a pressure loss upon the supply of the pressurized fluid into the pressure chamber is low. Therefore, in the case of low-pressure polishing, the use of the low-hardness elastic membrane may decrease a variation in the polishing rate along the circumferential direction of the wafer. High-pressure polishing herein refers to a polishing process performed with use of a pressurized fluid having a pressure of not less than approximately 2 psi (about 140 hPa), while low-pressure polishing herein refers to a polishing process performed with use of a pressurized fluid having a pressure of less than approximately 2 psi (about 140 hPa). A high-hardness elastic membrane herein refers to an elastic membrane having a Type A durometer of not less than 60 points, determined in accordance with ISO 7619, while a low-hardness elastic membrane herein refers to an elastic membrane having a Type A durometer of less than 60 points.

An elastic membrane to be used in the low-pressure polishing is preferably selected based on a combination of process consumables. For example, when using process consumables likely to be over-polishing of a peripheral portion of a wafer in the first-stage polishing, and using process consumables likely to be under-polishing of the peripheral portion of the wafer in the second-stage polishing, it is preferred to use a high-hardness elastic membrane in the first-stage polishing and use a low-hardness elastic membrane in the second-stage polishing. Depending on the combination of process consumables to be used, it is possible to use a low-hardness elastic membrane in the first-stage polishing and use a high-hardness elastic membrane in the second-stage polishing. Examples of the process consumables include a polishing pad, a polishing liquid, a dresser, etc.

A hardness of an elastic membrane to be used may be selected based on an initial film-thickness distribution before polishing. For example, when polishing a wafer having a large initial film thickness in a peripheral portion, a low-hardness elastic membrane may be used in the first-stage polishing to increase the polishing rate of the peripheral portion of the wafer, and a high-hardness elastic membrane may be used in the second-stage polishing to decrease the polishing rate of the peripheral portion of the wafer.

Figure 15:
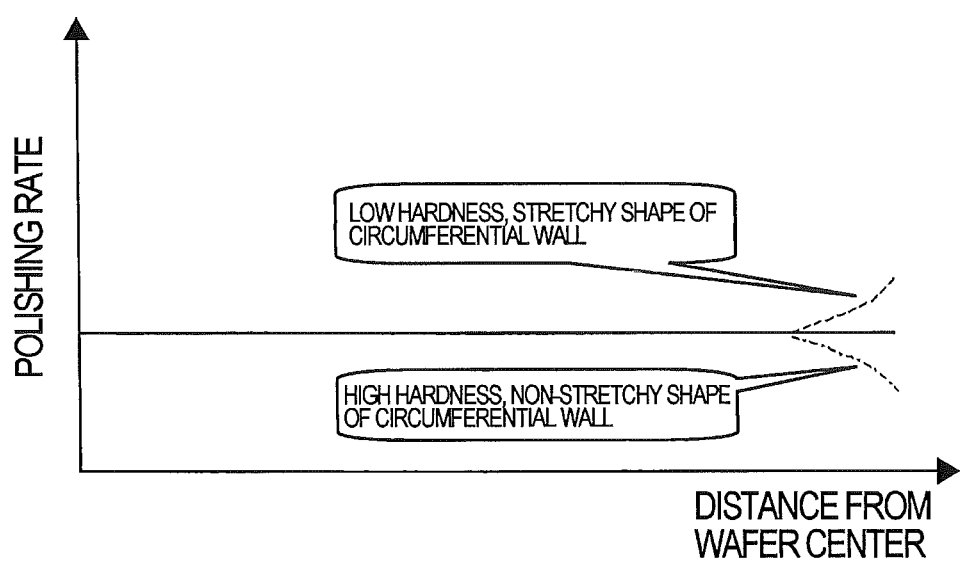
FIG. 15 is a graph showing an example of a polishing-rate distribution as obtained when a wafer is polished with use of an elastic membrane having a stretchy shape of circumferential wall or a low-hardness elastic membrane, and another example of a polishing-rate distribution as obtained when a wafer is polished with use of an elastic membrane having a non-stretchy shape of circumferential wall or a high-hardness elastic membrane.
Figure 16:
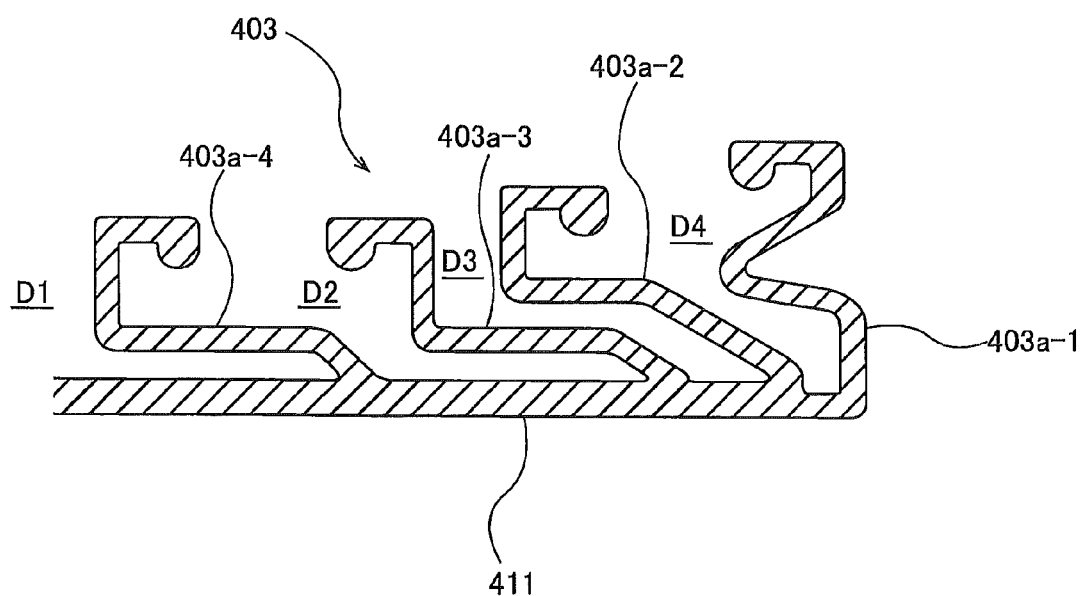
FIG. 16 is a cross-sectional view of an example of an elastic membrane having a stretchy shape of circumferential wall.

Specific examples of elastic membranes 403 having different shapes of circumferential walls will now be described. FIG. 15 is a graph showing an exemplary polishing-rate distribution as obtained when a wafer is polished with use of an elastic membrane 403 having a circumferential wall of stretchy shape or with use of a low-hardness elastic membrane 403, and an exemplary polishing-rate distribution as obtained when a wafer is polished with use of an elastic membrane 403 having a circumferential wall whose shape is less stretchy or with use of a high-hardness elastic membrane 403. FIG. 16 is a cross-sectional view of an exemplary elastic membrane 403 having a circumferential wall of stretchy shape, and FIG. 17 is a cross-sectional view of an exemplary elastic membrane 403 having a circumferential wall whose shape is less stretchy.

Figure 17:
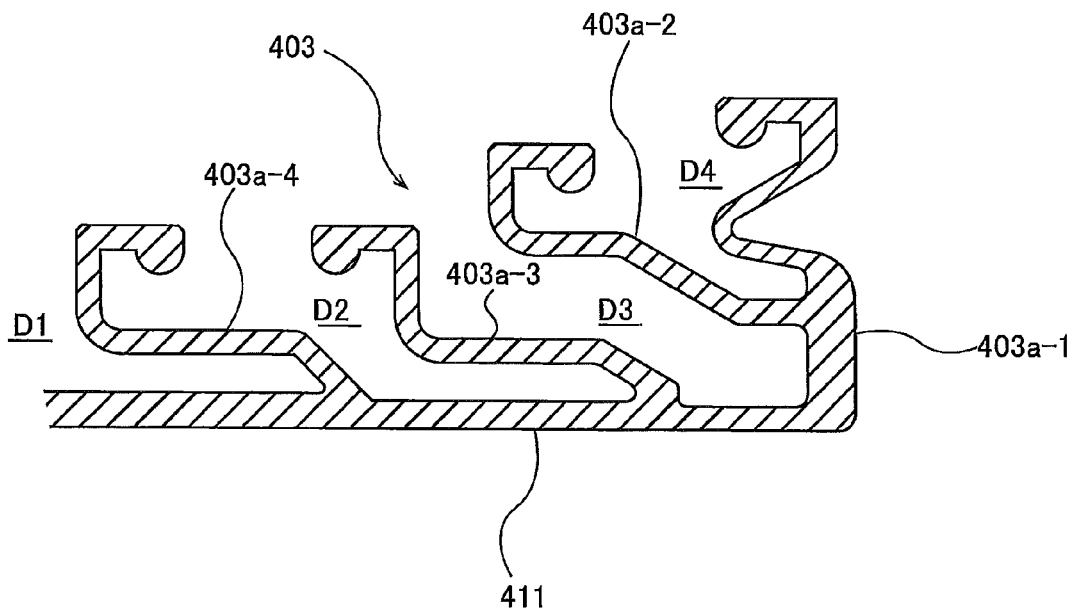
FIG. 17 is a cross-sectional view of an example of an elastic membrane having a non-stretchy shape of circumferential wall.

The elastic membranes 403 shown in FIGS. 16 and 17 each include an outermost first circumferential wall 403a-1, a second circumferential wall 403a-2 located inside the first circumferential wall 403a-1, a third circumferential wall 403a-3 located inside the second circumferential wall 403a-2, a fourth circumferential wall 403a-4 located inside the third circumferential wall 403a-3, and a circular contact portion 411 to be brought into contact with a wafer. Pressure chamber D4 is formed between the first circumferential wall 403a-1 and the second circumferential wall 403a-2, pressure chamber D3 is formed between the second circumferential wall 403a-2 and the third circumferential wall 403a-3, and pressure chamber D2 is formed between the third circumferential wall 403a-3 and the fourth circumferential wall 403a-4. In the examples shown in FIGS. 16 and 17, the holes formed in the lower surface of each elastic membrane 403 are located under the pressure chamber D1.

A difference in shape between the elastic membranes 403 of FIGS. 16 and 17 resides in a thickness of the outermost first circumferential wall 403a-1. The first circumferential wall 403a-1 having an increased thickness can achieve a polishing profile in which a polishing rate of a peripheral portion of a wafer is low. For example, the thickness of the first circumferential wall 403a-1 of FIG. 16 may be not less than 0.5 mm and not more than 1.5 mm, while the thickness of the first circumferential wall 403a-1 of FIG. 17 may be not less than 1.5 mm and not more than 4 mm.

Another difference between the elastic membranes 403 of FIGS. 16 and 17 resides in a connecting position of the second circumferential wall 403a-2. In the example shown in FIG. 16, the first circumferential wall 403a-1, the second circumferential wall 403a-2, the third circumferential wall 403a-3 and the fourth circumferential wall 403a-4 are all connected to the contact portion 411, while in the example shown in FIG. 17, the second circumferential wall 403a-2 is connected to the first circumferential wall 403a-1, and the first circumferential wall 403a-1, the third circumferential wall 403a-3, and the fourth circumferential wall 403a-4 are connected to the contact portion 411. With the shape shown in FIG. 17, the polishing rate of the wafer changes in a narrower area with a change in the pressure in the pressure chamber D4, compared to the shape shown in FIG. 16.

As discussed above, the area of the wafer, which responds to a change in the pressure in the pressure chamber D4, differs between the elastic membranes 403 of FIGS. 16 and 17 due to the difference in the connecting position of the second circumferential wall 403a-2. Therefore, the use of these elastic membranes 403 in multistage polishing makes it possible to obtain polishing characteristics that meet various demands. For example, in the first-stage polishing, the elastic membrane 403 of FIG. 16 is used and the pressure in the pressure chamber D4 is made high to increase a polishing rate of a wafer in a relatively wide area. In the second-stage polishing, the elastic membrane 403 of FIG. 17 is used and the pressure in the pressure chamber D4 is made low to decrease the polishing rate of the wafer in a relatively narrow area. It is possible to interchange the elastic membranes 403 used in the first-stage polishing and the second-stage polishing, or to change the pressures in the pressure chambers D4.

Figure 18:
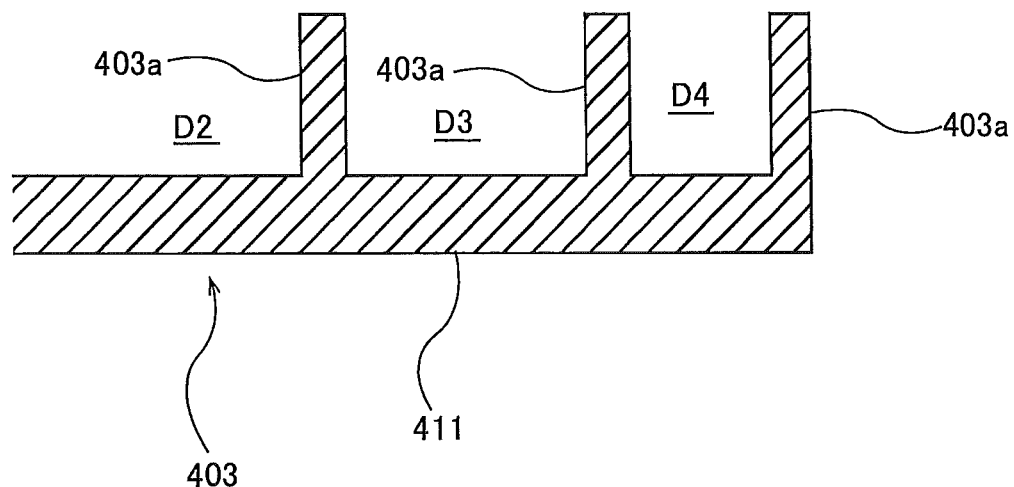
FIG. 18 is a cross-sectional view of a modification of the elastic membrane of the polishing head, shown in FIG. 3.

A specific example of elastic membrane 403 whose contact portion 411 to be brought into contact with a wafer has a different thickness will now be described. FIG. 18 is a cross-sectional view of another example of the elastic membrane 403 of the polishing head shown in FIG. 6. The elastic membrane 403 shown in FIG. 18 has a contact portion 411 which is thicker than the contact portion 411 of the elastic membrane 403 shown in FIG. 6. An increase in the thickness of the contact portion 411 of the elastic membrane 403 produces a similar effect to that produced by an increase in the hardness of the elastic membrane 403. Specifically, the thick contact portion 411 can reduce a deformation or twist of the elastic membrane 403. In particular, the elastic membrane 403 having the thick contact portion 411 can prevent the leakage of the pressurized fluid and can prevent a non-uniform pressing force during the high-pressure polishing.

Further, the increase in the thickness of the contact portion 411 increases a damping effect, making it possible to prevent abnormal noise or vibration of the polishing head or the polishing apparatus. Therefore, the use of the elastic membrane 403 having a thick contact portion 411 in the high-pressure polishing can increase the polishing rate, thereby increasing the throughput. On the other hand, the elastic membrane 403 having a thin contact portion 411, because of enhanced sealing capability between it and a wafer, can prevent the leakage of the pressurized fluid through the holes formed in the contact portion 411 of the elastic membrane 403. With regard to the elastic membrane 403 having a thin contact portion 411, the thickness of the contact portion 411 is, for example, not less than 0.5 mm and not more than 1 mm. With regard to the elastic membrane 403 having a thick contact portion 411, the thickness of the contact portion 411 is, for example, more than 1 mm and not more than 4 mm. It is possible to partly vary the thickness of the contact portion 411. For example, a portion of the pressure chamber communicating with the holes may be made thin, and the other portion may be made thick.

Figure 19:
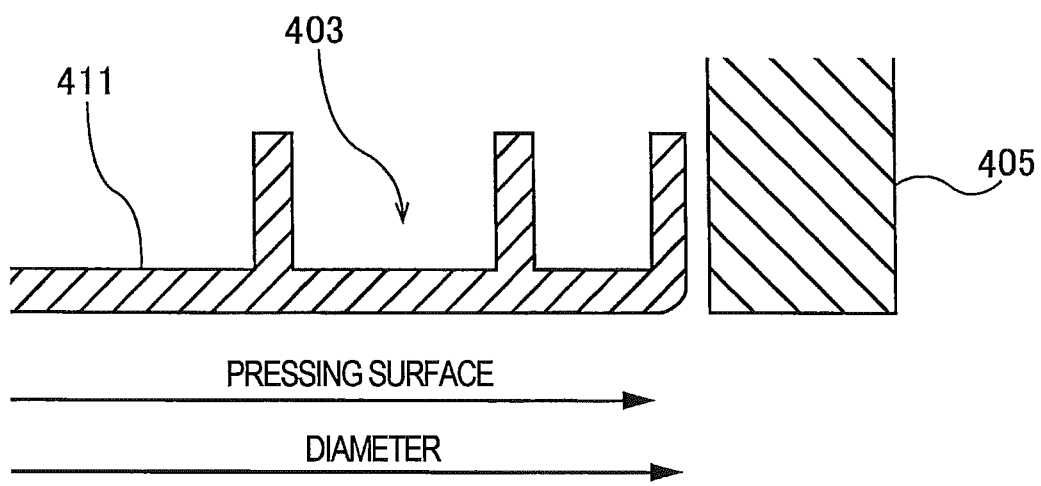
FIG. 19 is a cross-sectional view partly showing the elastic membrane and the retainer ring, shown in FIG. 3.
Figure 20:
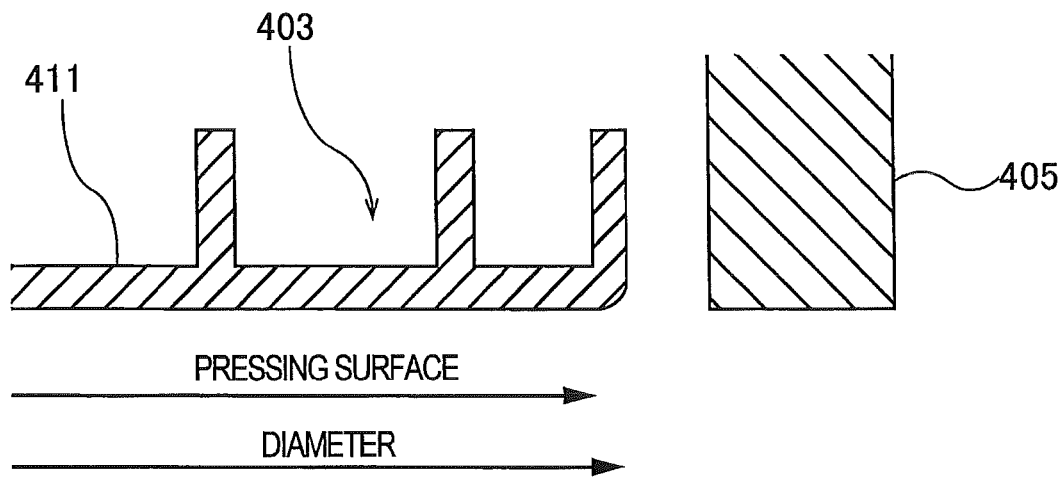
FIG. 20 is a cross-sectional view partly showing an elastic membrane having a smaller diameter and a smaller pressing surface than those of the elastic membrane shown in FIG. 19.
Figure 21:
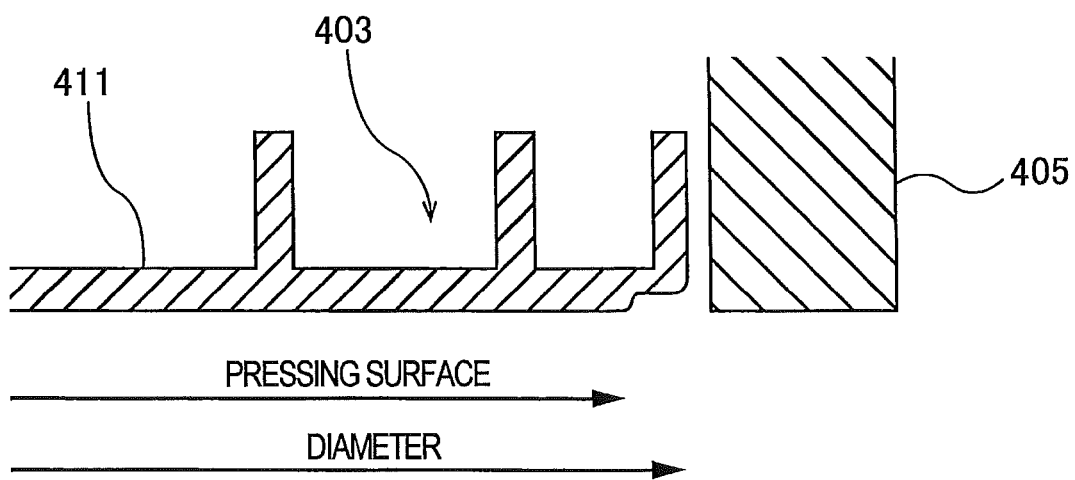
FIG. 21 is a cross-sectional view partly showing an elastic membrane having the same diameter as, but having a smaller pressing surface than those of the elastic membrane shown in FIG. 19.

Specific examples of elastic membranes 403 whose pressing surfaces to press a wafer (wafer pressing surfaces or substrate pressing surfaces) have different areas will now be described. FIGS. 19, 20 and 21 show exemplary elastic membranes 403 whose pressing surfaces have different areas. The elastic membranes 403 shown in FIGS. 19 and 20 have different diameters. The elastic membrane 403 shown in FIG. 21 has the same diameter as the elastic membrane 403 shown in FIG. 19. However, with a stepped portion formed in the edge of the contact portion 411, the elastic membrane 403 of FIG. 21 has a smaller pressing surface than the elastic membrane 403 shown in FIG. 19. Generally, use of the elastic membrane 403 having a smaller diameter generates a lower pressure on a peripheral portion of a wafer, resulting in a lower polishing rate of the peripheral portion of the wafer. Conversely, use of the elastic membrane 403 having a larger diameter results in a higher polishing rate of the peripheral portion of the wafer.

When the elastic membrane 403 having a small diameter is used, a large gap is formed between the retainer ring 405 and the elastic membrane 403 as shown in FIG. 20. The elastic membrane 403, holding a wafer, may therefore laterally move a long distance, and as a result the pressure on the wafer may become unstable. To avoid this, as shown in FIG. 21, it may be effective to use the elastic membrane 403 having a smaller pressing surface with the same diameter as that of the elastic membrane 403 shown in FIG. 19.

Figure 22:
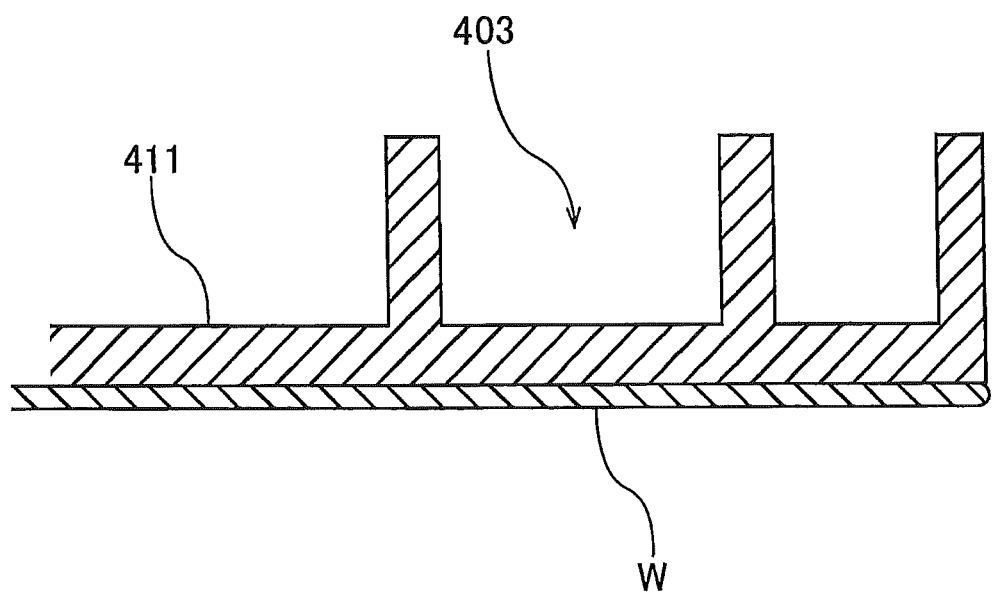
FIG. 22 is a cross-sectional view showing an elastic membrane whose contact portion, which is to be brought into contact with a wafer, has approximately a right-angled edge.
Figure 23:
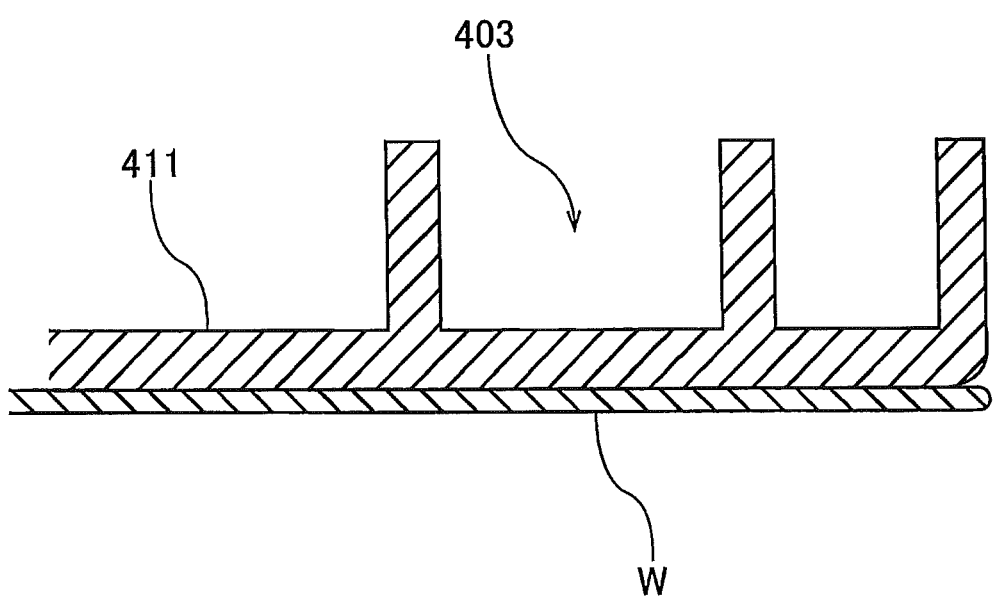
FIG. 23 is a cross-sectional view showing an elastic membrane whose contact portion, which is to be brought into contact with a wafer, has an oval edge.
Figure 24:
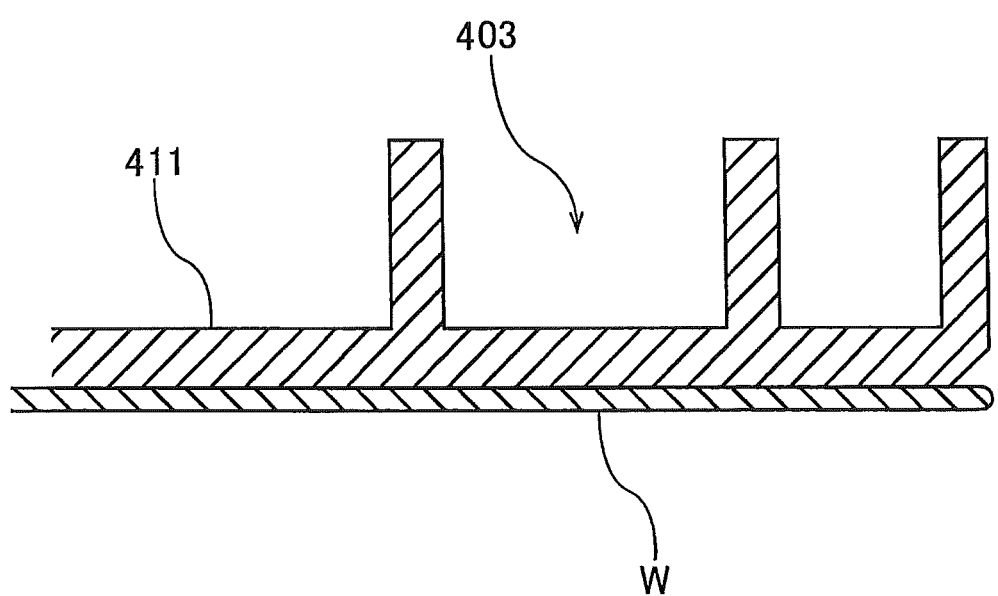
FIG. 24 is a cross-sectional view showing an elastic membrane whose contact portion, which is to be brought into contact with a wafer, has an inclined edge.

Specific examples of elastic membranes 403 whose contact portions 411 have different edge shapes will now be described. FIGS. 22, 23 and 24 show exemplary elastic membranes 403 whose contact portions 411 have different edge shapes. More specifically, the edge of the contact portion 411 shown in FIG. 22 has approximately a right-angled shape, the edge of the contact portion 411 shown in FIG. 23 has an oval shape, and the edge of the contact portion 411 shown in FIG. 24 has a slope. The elastic membrane 403 shown in FIG. 22 can apply a pressing force to an outermost edge of a wafer W, and can therefore increase the polishing rate of the peripheral portion of the wafer. The elastic membranes 403 shown in FIGS. 23 and 24 do not make contact with the outermost edge of the wafer W, and therefore cannot apply a pressing force to the outermost edge of the wafer W. Accordingly, the use of the elastic membrane 403 of FIG. 23 or 24 can lower the polishing rate of the peripheral portion of the wafer W, as compared to the use of the elastic membrane 403 of FIG. 22.

Figure 25:
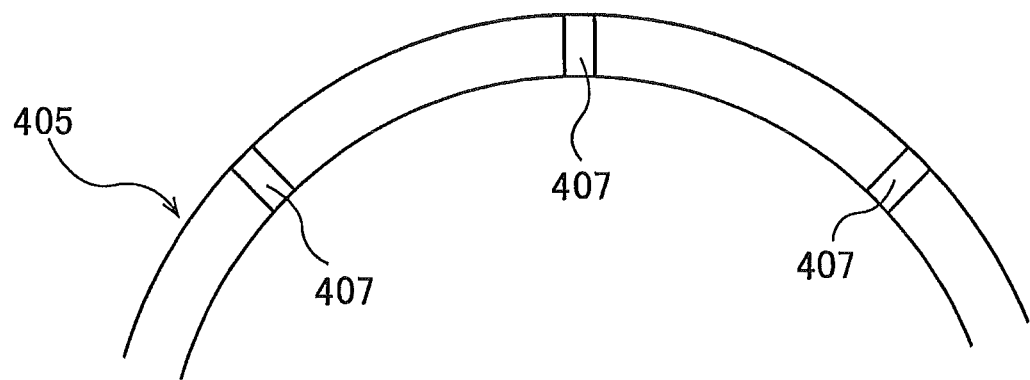
FIG. 25 is a diagram showing grooves formed in a bottom surface of a retainer ring.

Specific examples of retainer rings 405 having different structures will now be described. As shown in FIG. 25, a plurality of grooves, which allow the polishing liquid to move from the outside to the inside of the retainer ring 45 and from the inside to the outside of the retainer ring 45, are formed in the bottom of the retainer ring 405. Each groove 407 extends from an inner circumferential surface to an outer circumferential surface of the retainer ring 405. The grooves 407 are arranged at regular intervals over an entire circumference of the retainer ring 405.

Figure 26:
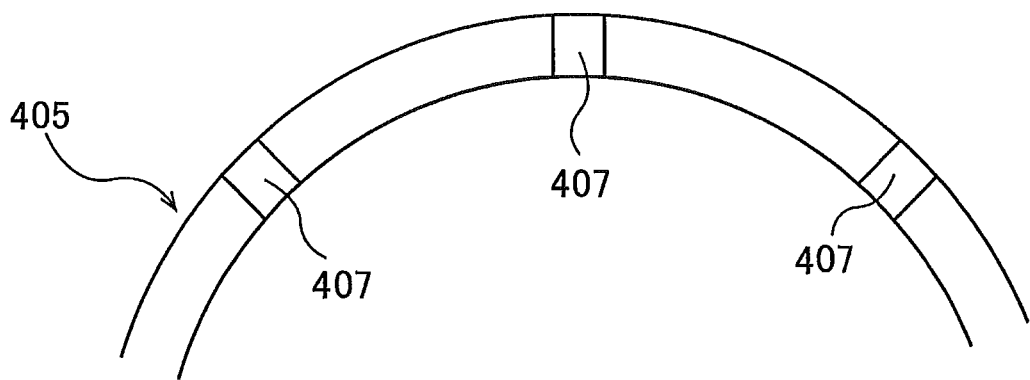
FIG. 26 is a diagram showing another example of grooves formed in a bottom surface of a retainer ring.
Figure 27:
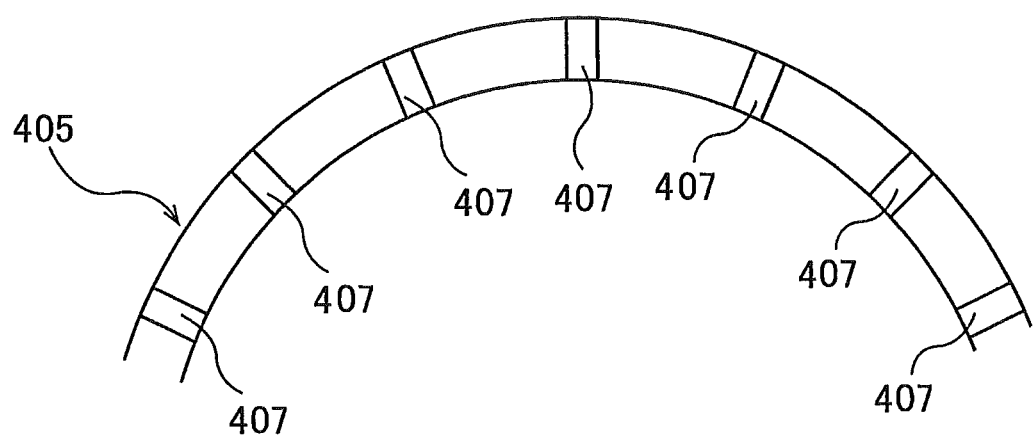
FIG. 27 is a diagram showing yet another example of grooves formed in the bottom of a retainer ring.
Figure 28:
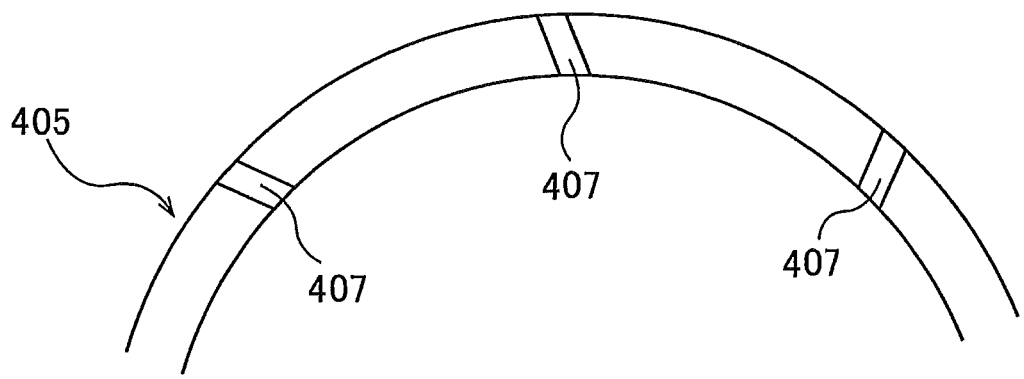
FIG. 28 is a diagram showing yet another example of grooves formed in a bottom surface of a retainer ring.
Figure 29:
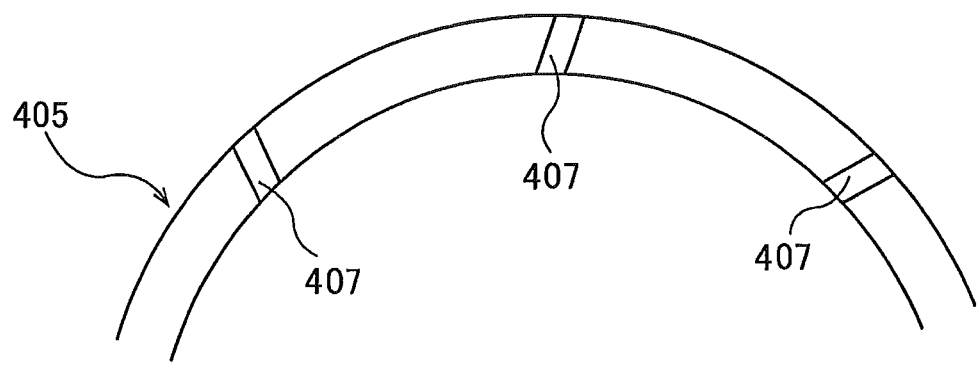
FIG. 29 is a diagram showing yet another example of grooves formed in a bottom surface of a retainer ring.

In the example shown in FIG. 25, the grooves 407 extend in the radial direction of the retainer ring 405. The number of grooves 407 shown in FIG. 26 is the same as the number of grooves 407 shown in FIG. 25, while the grooves 407 shown in FIG. 26 are wider than the grooves 407 shown in FIG. 25. The grooves 407 shown in FIG. 27 have the same width as the grooves 407 shown in FIG. 25, while the number of grooves 407 shown in FIG. 27 is larger than the number of grooves 407 shown in FIG. 25. Though not shown diagrammatically, both the number and the width of grooves 407 may be varied. Further, as shown in FIGS. 28 and 29, the grooves 407 may be inclined with respect to the radial direction of the retainer ring 405. Differences in the structure of the retainer ring 405 include a difference in the number of grooves 407, a difference in the shape of each groove 407, and the presence or absence of grooves 407.

Figure 30:
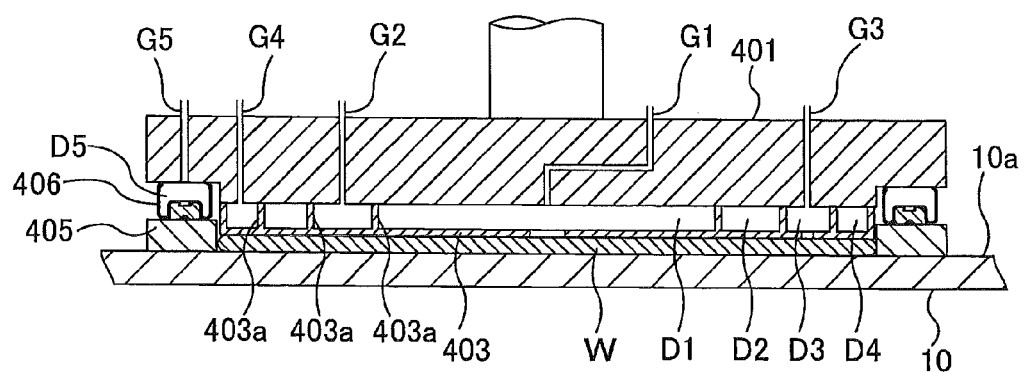
FIG. 30 is a cross-sectional view of a polishing head having a retainer ring with a large radial width.
Figure 31:
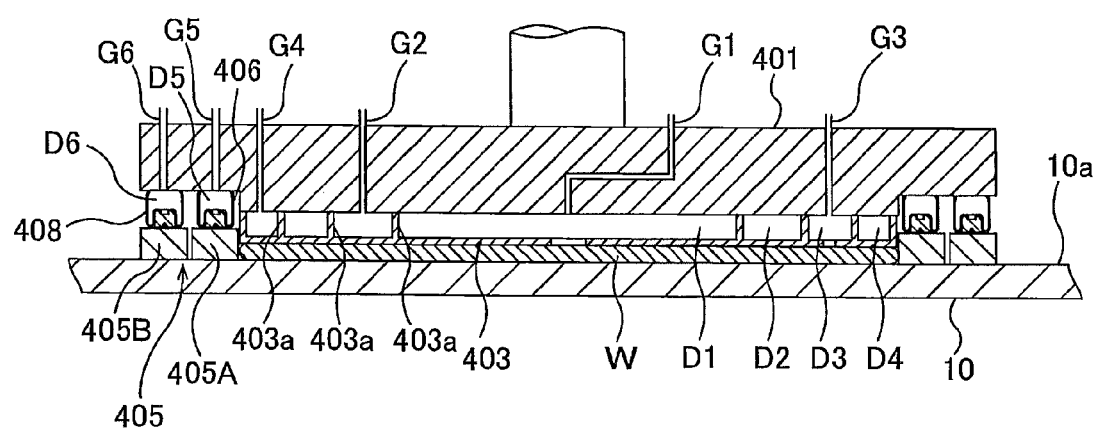
FIG. 31 is a cross-sectional view of a polishing head having double retainer rings.

FIG. 30 is a cross-sectional view of a polishing head having a retainer ring 405 with a large radial width. The wide retainer ring 405 as shown in FIG. 30 may be used. FIG. 31 is a cross-sectional view of a polishing head having double retainer rings. Retainer rings 405 shown in FIG. 31 include an inner retainer ring 405A and an outer retainer ring 405B. The inner retainer ring 405A is coupled to an annular elastic membrane 406 which forms pressure chamber D5 therein, and the outer retainer ring 405B is coupled to an annular elastic membrane 408 which forms pressure chamber D6 therein. The outer retainer ring 405B is arranged outside the inner retainer ring 405A so as to surround the inner retainer ring 405A. The pressure chamber D5 is coupled to fluid line G5, and the pressure chamber D6 is coupled to fluid line G6.

The inner retainer ring 405A or the outer retainer ring 405B may be pressed by any other method.

The use of the retainer ring 405 as shown in FIGS. 25 through 31 changes the rebound state of the polishing pad 10, thereby changing the profile of the peripheral portion of the wafer and also changing the flow of polishing liquid toward the wafer surface and the flow of polishing liquid away from the wafer surface. Thus, the results of polishing may vary depending on the structure of the retainer ring 405. Based on a required process performance, different retainer rings 405 may be used in the first-stage polishing and the second-stage polishing.

The polishing pad 10 is usually composed of nonwoven fabric, foamed polyurethane, a porous resin, a non-porous resin, or the like. A fixed-abrasive pad holding abrasive particles may be used. A polishing pad composed of nonwoven fabric or suede, which has a lower hardness than foamed polyurethane, may have a short life due to contact with the edge portion of the retainer ring 405. In such a case, it is preferred to use the retainer ring 405 having the small number of grooves 407, the retainer ring 405 having no groove 407, or the retainer ring 405 having narrow grooves 407. Such retainer rings 405 can reduce friction between the polishing pad and the edge portion of the retainer rings 405, and therefore can increase the life of the polishing pad.

Figure 32:
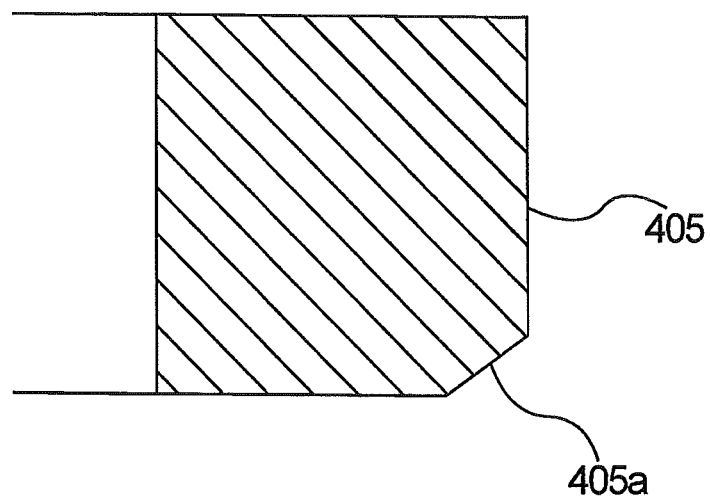
FIG. 32 is a cross-sectional view of a retainer ring whose outer edge portion, which is to be brought into contact with a polishing pad, has a tapered shape.
Figure 33:
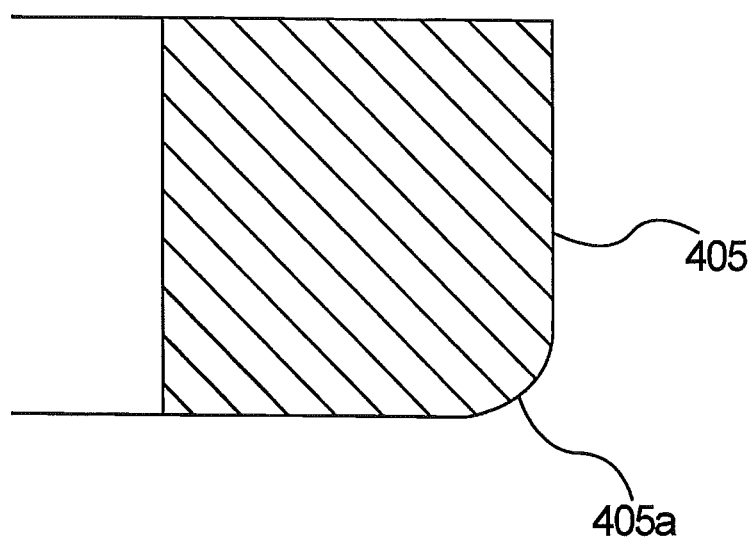
FIG. 33 is a cross-sectional view of a retainer ring whose outer edge portion, which is to be brought into contact with a polishing pad, has an oval shape.

It is also possible to use a retainer ring 405 whose outer edge portion 405a, which is to be brought into contact with the polishing pad 10, has a tapered or oval shape as shown in FIGS. 32 and 33. Such retainer ring 405 can also reduce friction between the polishing pad 10 and the outer edge portion 405a of the retainer ring 405, thereby increasing the life of the polishing pad 10.

It is possible to use a polishing pad made of a relatively hard material, such as foamed polyurethane, in first-stage rough polishing and to use, in second-stage final polishing, a polishing pad which is softer than the polishing pad used in the first-stage polishing. In this case, the life of the polishing pad for the final polishing can be increased by using, in the second-stage final polishing, a retainer ring 405 having a different structure from a retainer ring 405 used in the first-stage polishing. Examples of the retainer ring 405 for use in the second-stage final polishing include a retainer ring having the small number of grooves 407, a retainer ring having no groove 407, a retainer ring having narrow grooves 407, a retainer ring whose outer edge portion, which is to make contact with the polishing pad, has a tapered shape, and a retainer ring whose outer edge portion has an oval shape.

Specific examples of retainer rings 405 composed of different materials will now be described. The retainer ring 405 is usually rubbed against the polishing pad 10 in the presence of the polishing liquid, and therefore the bottom surface of the retainer ring 405 wears gradually. Fine particles, generated from the retainer ring 405, can be attached as foreign matter to a wafer during polishing of the wafer or cause damage, such as scratching, to the surface of the wafer. Therefore, when using a polishing liquid containing abrasive particles, it is preferred to use a retainer ring 405 made of a material having high wear resistance. When using a polishing liquid containing no abrasive particles or containing abrasive particles at a low concentration, it is preferred to use a retainer ring 405 made of a soft material in order to prevent scratching of a wafer. In order to meet various requirements for multi-stage polishing, the use of retainer rings 405 of different materials in the first-stage polishing and the second-stage polishing is sometimes effective. Examples of materials usable for retainer rings 405 include ceramics such as SiC, resins such as PPS, PEEK, PTFE, PP, polycarbonate and polyurethane, and the resins containing a filler to enhance the wear resistance.

The polishing apparatus may include a common polishing table provided with different types of polishing heads. According to this type of polishing apparatus, the first-stage polishing and the second-stage polishing of a substrate can be performed using polishing heads having different constructions on the same polishing surface.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method comprising:
providing a first polishing head having a plurality of pressure chambers;
holding a substrate by the first polishing head;
performing first profile control polishing of the substrate by pressing the substrate against a first polishing pad by the first polishing head;
providing a second polishing head having a plurality of pressure chambers whose arrangement is different from an arrangement of the pressure chambers of the first polishing head;
holding the substrate, which has been polished with use of the first polishing head, by the second polishing head; and
performing second profile control polishing of the substrate by pressing the substrate against a second polishing pad by the second polishing head.

2. The polishing method according to claim 1, wherein the pressure chambers of the second polishing head are arranged at positions corresponding to positions of boundaries between the pressure chambers of the first polishing head.

3. The polishing method according to claim 1, further comprising:
providing a rigid-body polishing head having a substrate holding material;
holding the substrate by the rigid-body polishing head;
performing rough polishing of the substrate by pressing the substrate against a polishing pad by the rigid-body polishing head;
providing a single-chamber polishing head having a single pressure chamber;
holding the substrate by the single-chamber polishing head;
performing final polishing of the substrate by pressing the substrate against a polishing pad by the single-chamber polishing head,
wherein the rough polishing, the first profile control polishing, the second profile control polishing, and the final polishing of the substrate are performed in this order.

4. The method according to claim 1, comprising:
wherein pressing the substrate against the first polishing pad comprises receiving a pressure of a fluid within at least one of a plurality of pressure chambers of the first polishing head; and
wherein pressing the substrate against the second polishing pad to polish by the second polishing head comprises receiving a pressure of a fluid within at least one of the plurality of pressure chambers of the second polishing head,
wherein the plurality of the pressure chambers of the first polishing head comprises a first elastic membrane and the plurality of the pressure chambers of the second polishing head comprises a second elastic membrane having a hardness different from a hardness of the first elastic membrane.

5. The method according to claim 4, wherein the second elastic membrane comprises a circumferential wall whose shape is different from a shape of a circumferential wall of the first elastic membrane.

6. The method according to claim 4, wherein the second elastic membrane comprises a contact portion which is to be brought into contact with the substrate, the contact portion having a thickness different from that of a contact portion, which is to be brought into contact with the substrate, of the first elastic membrane.

7. The method according to claim 4, wherein the second elastic membrane comprises a substrate pressing surface whose area is different from an area of a substrate pressing surface of the first elastic membrane.

8. The method according to claim 4, wherein the second elastic membrane has a contact portion which is to be brought into contact with the substrate, the contact portion having an edge whose shape is different from a shape of an edge of a contact portion, which is to be brought into contact with the substrate, of the first elastic membrane.

9. The method according to claim 4, further comprising:
surrounding the substrate with a first retainer ring of the first polishing head; and
pressing the first retainer ring of the first polishing head against the first polishing pad.

10. The method according to claim 9, further comprising:
surrounding the substrate with a second retainer ring of the second polishing head, the second retainer ring having a structure different from that of the first retainer ring; and
pressing the second retainer ring of the second polishing head against the second polishing pad.

* * * * *